US012695456B2

(12) United States Patent
Lee et al.

(10) Patent No.: US 12,695,456 B2
(45) Date of Patent: Jul. 28, 2026

(54) BIDIRECTIONAL COUNTER AND INTEGRATED CIRCUIT INCLUDING THE SAME

(71) Applicant: SAMSUNG ELECTRONICS CO., LTD., Suwon-si (KR)

(72) Inventors: Jaeha Lee, Suwon-si (KR); Bai-Sun Kong, Suwon-si (KR); Bomin Joo, Suwon-si (KR)

(73) Assignees: SAMSUNG ELECTRONICS CO., LTD., Suwon-si (KR); RESEARCH & BUSINESS FOUNDATION SUNGKYUNKWAN UNIVERSITY, Suwon-si (KR)

( * ) Notice: Subject to any disclaimer, the term of this patent is extended or adjusted under 35 U.S.C. 154(b) by 43 days.

(21) Appl. No.: 18/818,024

(22) Filed: Aug. 28, 2024

(65) Prior Publication Data

US 2025/0080119 A1    Mar. 6, 2025

(30) Foreign Application Priority Data

Aug. 28, 2023    (KR) ........................ 10-2023-0113194
Dec. 18, 2023    (KR) ........................ 10-2023-0185066

(51) Int. Cl.
*H03K 23/56*          (2006.01)
*H03K 23/44*          (2006.01)
*H03M 1/48*           (2006.01)

(52) U.S. Cl.
CPC ............. *H03K 23/56* (2013.01); *H03K 23/44* (2013.01); *H03M 1/48* (2013.01)

(58) Field of Classification Search
CPC ...... H03K 23/40; H03K 23/42; H03K 23/425; H03K 23/44; H03K 23/50; H03K 23/52;
(Continued)

(56) References Cited

U.S. PATENT DOCUMENTS 5,488,404 A      1/1996    Fleck et al.
6,018,560 A  *   1/2000    Kim ........................ H03K 23/62
                                                              377/45
(Continued)

FOREIGN PATENT DOCUMENTS

KR          10-0480286 B1      4/2005
KR          10-0879747 B1      1/2009

OTHER PUBLICATIONS

Kim et al., "Low-Power CMOS Synchronous Counter With Clock Gating Embedded Into Carry Propagation", IEEE Transactions on Circuits and Systems—II: Express Briefs, vol. 56, No. 8, Aug. 2009, pp. 649-653 (5 pages total).

*Primary Examiner* — Long Nguyen
(74) *Attorney, Agent, or Firm* — Sughrue Mion, PLLC

(57) ABSTRACT

Disclosed are a bidirectional counter and a method of generating output data. The bidirectional counter may include at least one first flip-flop configured to generate, based on at least one first local clock, at least one first bit including a least significant bit (LSB) of the output data and a second bit that is an upper bit of the at least one first bit, and a local clock generation circuit configured to generate, in response to an up signal that is activated, the at least one first local clock based on the input clock and the at least one first bit, and to generate, in response to the up signal that is deactivated, the at least one first local clock based on the input clock and at least one inverted first bit.

20 Claims, 17 Drawing Sheets

(58) Field of Classification Search
CPC ........ H03K 23/548; H03K 23/56; G06F 1/04;
G06F 1/06; G06F 1/10; H03M 1/48
See application file for complete search history.

(56) References Cited

U.S. PATENT DOCUMENTS

| 6,198,429 | B1 | 3/2001 | Fujikawa et al. |
| 6,452,864 | B1 | 9/2002 | Condemi et al. |
| 6,590,951 | B1 | 7/2003 | Kim et al. |
| 7,185,293 | B1 | 2/2007 | Ofer |
| 7,528,626 | B2 | 5/2009 | Kim |
| 7,889,660 | B2 | 2/2011 | Bugenhagen |
| 11,451,731 | B2 * | 9/2022 | Koo ........................ H04N 25/46 |

* cited by examiner

BIDIRECTIONAL COUNTER AND INTEGRATED CIRCUIT INCLUDING THE SAME

CROSS-REFERENCE TO RELATED APPLICATION

This application is based on and claims priority under 35 U.S.C. § 119 to Korean Patent Application Nos. 10-2023-0113194 and 10-2023-0185066, respectively filed on Aug. 28, 2023 and Dec. 18, 2023, in the Korean Intellectual Property Office, the disclosures of which are herein incorporated by reference in their entireties.

BACKGROUND

One or more example embodiments of the disclosure relate to a counter, and more particularly, to a bidirectional counter and an integrated circuit including the same.

A counter may refer to a device that stores a number of times a particular event has occurred. For example, a counter may receive a clock and store a number of times a rising edge or a falling edge of the clock has occurred. Counters may be used in a variety of applications, and integrated circuits manufactured using semiconductor fabrication processes may include a plurality of counters. As clock frequencies and integration density of integrated circuits increase, counters with a high operating speed and a small area may be required.

SUMMARY

One or more example embodiments of the disclosure provide a bidirectional counter with a high operating speed and a limited area and an integrated circuit including the bidirectional counter.

According to an aspect of an example embodiment of the invention, provided is a bidirectional counter configured to generate output data based on an input clock, including at least one first flip-flop configured to generate, based on at least one first local clock, at least one first bit including a least significant bit (LSB) of the output data and a second bit that is an upper bit of the at least one first bit, and a local clock generation circuit configured to generate, in response to an up signal that is activated, the at least one first local clock based on the input clock and the at least one first bit, and to generate, in response to the up signal that is deactivated, the at least one first local clock based on the input clock and at least one inverted first bit that corresponds to an inverted version of the at least one first bit.

According to an aspect of the inventive concept, a bidirectional counter configured to generate output data based on an input clock includes at least one first flip-flop configured to generate, based on at least one first local clock, a most significant bit (MSB) of the output data and at least one first bit that is lower than the MSB, a first pre-evaluation circuit configured to generate, in response to an up signal that is activated, at least one first ripple carry based on the at least one first bit and a second bit that is lower than the at least one first bit, and to generate, in response to the up signal that is deactivated, the at least one first ripple carry, based on an inverted second bit that corresponds to an inverted version of the second bit and at least one inverted first bit that corresponds to an inverted version of the at least one first bit, and a first local clock selection circuit configured to generate the at least one first local clock, based on the input clock, a first carry input, and the at least one first ripple carry.

According to an aspect of the inventive concept, a method of generating output data that increases or decreases according to an input clock includes receiving an up signal; generating, in response to the up signal that is activated, at least one first local clock, based on the input clock and at least one first bit including an LSB of the output data, generating, in response to the up signal that is deactivated, the at least one first local clock based on the input clock and at least one inverted first bit that corresponds to an inverted version of the at least one first bit, and generating, based on the at least one first local clock, the at least one first bit and a second bit that is an upper bit of the at least one first bit.

BRIEF DESCRIPTION OF DRAWINGS

Embodiments of the inventive concept will be more clearly understood from the following detailed description taken in conjunction with the accompanying drawings in which:

FIG. 4 is a circuit diagram illustrating a local clock generator according to one or more example embodiments;

FIG. 6 is a circuit diagram illustrating a pre-evaluator according to one or more example embodiments;

DETAILED DESCRIPTION

Hereinafter, example embodiments are described with reference to the accompanying drawings.

Figure 1:
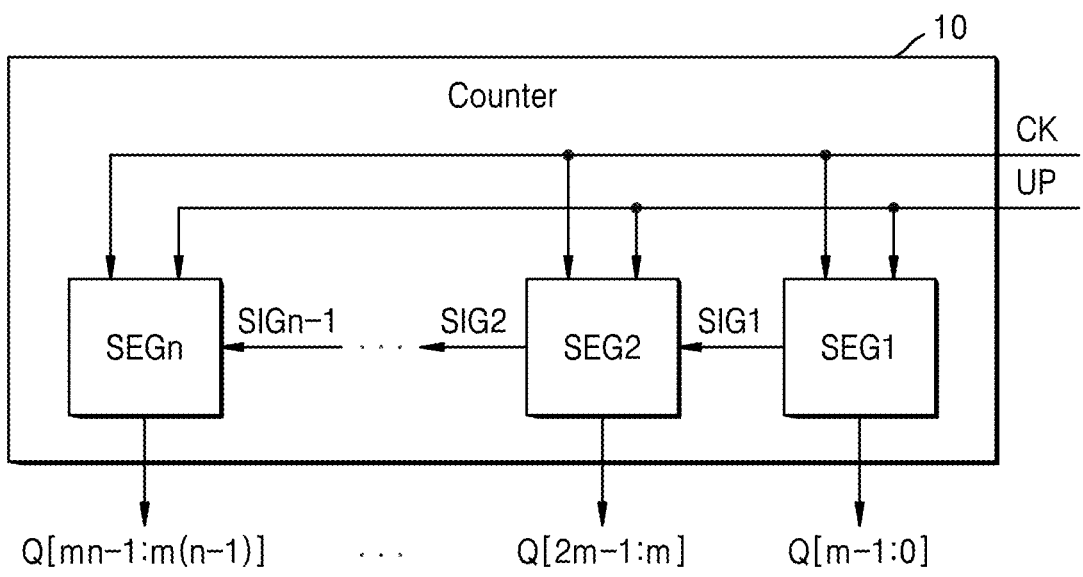
FIG. 1 is a block diagram of a counter according to one or more example embodiments.

FIG. 1 is a block diagram of a counter 10 according to one or more example embodiments. In some embodiments, the counter 10 may be included in an integrated circuit (IC) manufactured using a semiconductor fabrication process. Herein, unless otherwise specified, signals are assumed to be active-high signals with a logic high level when activated and a logic low level when deactivated, but it is noted that embodiments are not limited thereto. As used herein, logic high may correspond to a positive supply voltage VDD and may be represented as '1'. In addition, logic low may correspond to a negative supply voltage VSS and may be represented as '0'.

As shown in FIG. 1, the counter 10 may receive an input clock CK and an up signal UP. The counter 10 may count events based on the input clock CK. For example, the counter 10 may count a rising edge or a falling edge of the input clock CK and generate mn-bit output data Q having a value corresponding to a count (where m and n are integers greater than 1). Herein, the counter 10 is assumed to count rising edges of the input clock CK, but it is noted that embodiments are not limited thereto.

The counter 10 may operate as an up counter or a down counter according to the up signal UP. For example, the counter 10 may operate as an up counter in response to the up signal UP that is activated, e.g., "1", while the counter 10 may operate as a down counter in response to the up signal UP that is deactivated, e.g., "0". The counter 10 that operates as an up counter or a down counter according to the up signal UP may be referred to as an up-down counter or a bidirectional counter.

As shown in FIG. 1, the counter 10 may include a first segment to an n-th segment SEG1 to SEGn. Each of the first to n-th segments SEG1 to SEGn may receive the input clock CK and the up signal UP, and generate at least one bit of the output data Q. For example, as shown in FIG. 1, the first segment SEG1 may generate m bits Q[m−1:0] including a least significant bit (LSB) of the output data Q, the second segment SEG2 may generate upper m bits Q[2m−1:m], and the n-th segment SEGn may generate m bits Q[mn−1:m(n−1)] including a most significant bit (MSB) of the output data Q.

Each of the first to n-th segments SEG1 to SEGn may generate a signal provided to a segment adjacent thereto. For example, as shown in FIG. 1, the first segment SEG1 may generate a first signal SIG1 that is provided to the second segment SEG2. Similarly, the second segment SEG2 may generate a second signal SIG2 that is provided to the third segment SEG3, and the n-th segment SEGn may receive an (n−1)th signal SIGn−1 from the (n−1)th segment SEGn−1.

The first segment SEG1, which generates the m bits Q[m−1:0] including the LSB of the output data Q, may have a different structure than remaining segments that generate upper bits, such as the second segment SEG2 to the n-th segment SEGn. For example, the first segment SEG1 may generate the m bits Q[m−1:0] based on the input clock CK and the up signal UP, while each of the second segment SEG2 to the n-th segment SEGn may generate m bits based on a signal received from a previous segment as well as the input clock CK and the up signal UP.

As described below with reference to the drawings, the first segment SEG1 may include m flip-flops that generate m bits Q[m−1:0] and a local clock generator that provides m local clocks respectively to the m flip-flops. The local clock generator may generate m local clocks in different manners according to the up signal UP while using a simple structure, and thus support both up counting and down counting. Accordingly, an increased area in the counter 10 to implement up counting and down counting may be minimized, and the counter 10 may have a reduced area. Each of the second segment SEG2 to the n-th segment SEGn may pre-evaluate ripple carries and generate m local clocks based on the pre-evaluated ripple carries when a carry input is received. Accordingly, the output data Q may be updated faster, and the performance of the counter 10 may be increased.

Figure 2:
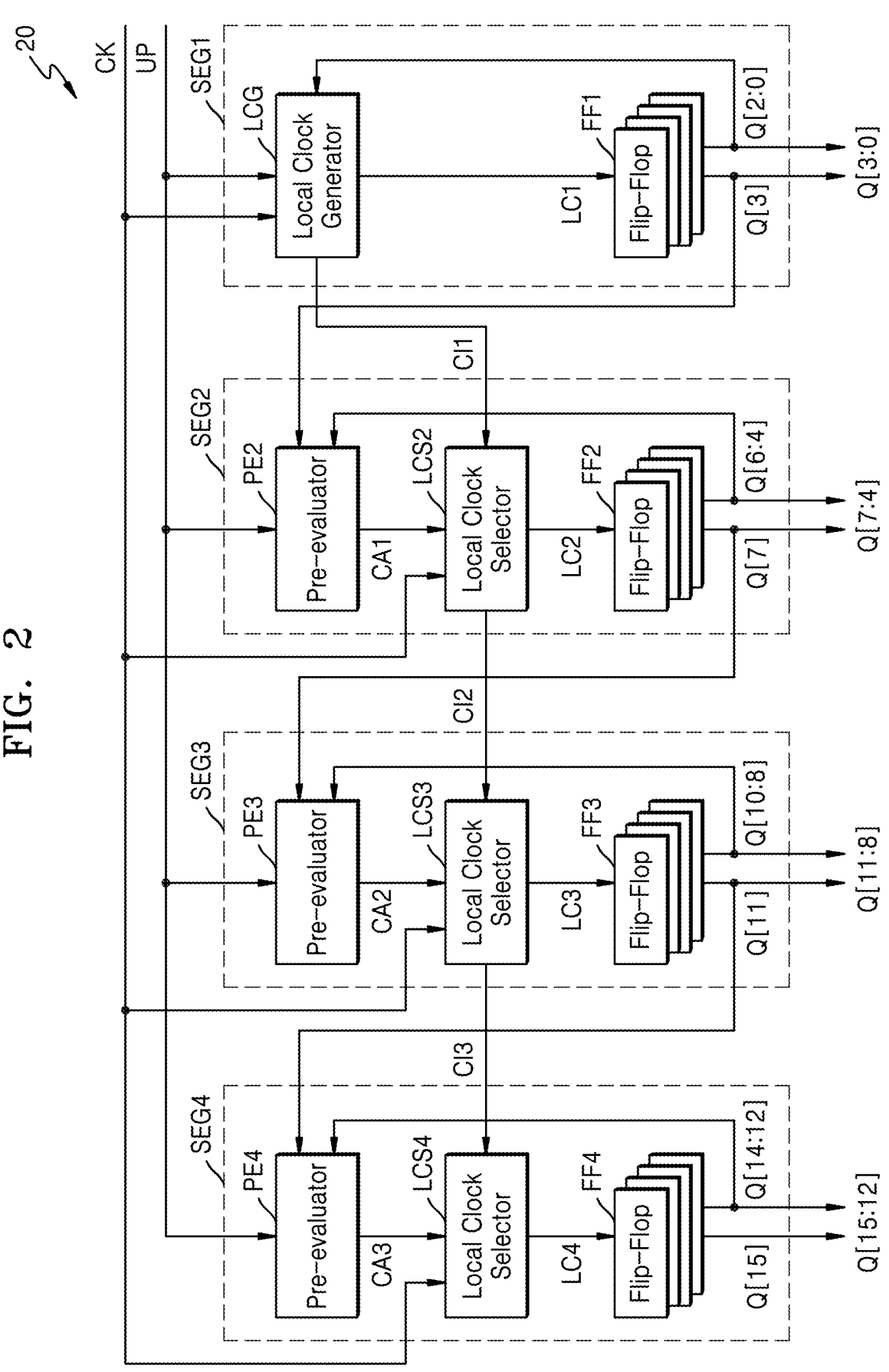
FIG. 2 is a block diagram of a counter according to one or more example embodiments.

FIG. 2 is a block diagram of a counter 20 according to one or more example embodiments. For example, the block diagram of FIG. 2 shows the counter 20 that generates output data Q that is 16 bits, and includes four segments each generating 4 bits of the output data Q (i.e., m=4 and n=4). In FIG. 2, although not shown for convenience of illustration, inverted signals of signals shown in FIG. 2 may be generated and transmitted together with the signals shown in FIG. 2, and inverters that generate the inverted signals are not shown. For convenience of description, the 16-bit counter 20 including first to fourth segments SEG1 to SEG4, each corresponding to 4 bits, will be described below, but it is noted that embodiments are not limited thereto.

As shown in FIG. 2, the counter 20 may include the first to fourth segments SEG1 to SEG4. Each of the first to fourth segments SEG1 to SEG4 may receive an input clock CK and an up signal UP, and generate 4 bits of the output data Q. Furthermore, each of the second to fourth segments SEG2 to SEG4 may receive a carry input and 1 bit of the output data Q from a previous segment. For example, the second segment SEG2 may receive a first carry input CI1 and a fourth bit Q[3] of the output data Q from the first segment SEG1, and the first signal SIG1 of FIG. 1 may include the first carry input CI1 and the fourth bit Q[3]. The third segment SEG3 may receive a second carry input CI2 and an eighth bit Q[7] of the output data Q from the second segment SEG2, and the second signal SIG2 of FIG. 1 may include the second carry input CI2 and the eighth bit Q[7]. The fourth segment SEG4 may receive a third carry input CI3 and a twelfth bit Q[11] of the output data Q from the third segment SEG3, and the (n−1)th signal SIGn−1 of FIG. 1 may include the third carry input CI3 and the twelfth bit Q[11].

The first segment SEG1 may include four first flip-flops FF1 and a local clock generator LCG. The four first flip-flops FF1 may receive a first local clock LC1 that is 4 bits, and generate 4 bits Q[3:0] of the output data Q according to the first local clock LC1. In some embodiments, each of the four first flip-flops FF1 may be a toggle flip-flop with an output that transitions on a rising edge of one bit of the first local clock LC1. As shown in FIG. 2, among the 4 bits Q[3:0] of the output data Q, lower 3 bits Q[2:0] may be provided to the local clock generator LCG, and the upper 1 bit that is the fourth bit Q[3] may be provided to the second segment SEG2.

The local clock generator LCG may generate the first local clock LC1 based on the input clock CK and the up signal UP. In some embodiments, in response to the activated up signal UP, the local clock generator LCG may generate the first local clock LC1 based on the input clock CK and the 3 bits Q[2:0] of the output data Q. In some embodiments, in response to the deactivated up signal UP, the local clock generator LCG may generate the first local clock LC1 based on the input clock CLK and 3 bits QB[2:0] of inverted output data (herein referred to as QB). The 3 bits QB[2:0] of the inverted output data correspond to an inverted version of the 3 bits Q[2:0] of the output data Q. An example of the local clock generator LCG is described below with reference to FIG. 4. As described below with reference to FIG. 4, a local clock generator LCG may include transistors and may be referred to as a local clock generation circuit.

The second segment SEG2 may include four second flip-flops FF2, a pre-evaluator PE2, and a local clock selector LCS2. The four second flip-flops FF2 may receive a second local clock LC2, and generate 4 bits Q[7:4] of the output data Q in response to the second local clock LC2. In some embodiments, each of the four second flip-flops FF2 may be a toggle flip-flop that changes its output on a rising edge of one bit of the second local clock LC2. As shown in FIG. 2, among the 4 bits Q[7:4] of the output data Q, the lower 3 bits Q[6:4] may be provided to the pre-evaluator PE2, and the upper 1 bit that is the eighth bit Q[7] may be provided to the third segment SEG3.

The pre-evaluator PE2 may generate a first ripple carry CA1 based on the up signal UP and 4 bits Q[6:3] of the output data Q. In some embodiments, in response to the activated up signal UP, the pre-evaluator PE2 may generate the first ripple carry CA1 based on the 4 bits Q[6:3] of the output data Q. In some embodiments, in response to the deactivated up signal UP, the pre-evaluator PE2 may generate the first ripple carry CA1 based on 4 bits QB [6:3] of the inverted output data QB. An example of the pre-evaluator PE2 will be described in more detail below with reference to FIG. 6. As described below with reference to FIG. 6, the pre-evaluator PE2 may include transistors and may be referred to as a pre-evaluator circuit.

The local clock selector LCS2 may generate the second local clock LC2 and the second carry input CI2 based on the first ripple carry CA1 and the first carry input CI1. The first ripple carry CA1 may be pre-evaluated by the pre-evaluator PE2 before the first carry input CI1 is activated, and the local clock selector LCS2 may generate the second local clock LC2 based on the first ripple carry CA1 when the activated first carry input CI1 is received. Accordingly, the second local clock LC2 may be generated earlier. Examples of the local clock selector LCS2 will be described in more detail below with reference to FIGS. 8A and 8B. As described later with reference to FIGS. 8A and 8B, the local clock selector LCS2 may include transistors and may be referred to as a local clock generation circuit.

Each of the third segment SEG3 and fourth segment SEG4 may have the same structure as the second segment SEG2. The third segment SEG3 may include four third flip-flops FF3, a pre-evaluator PE3, and a local clock selector LCS3. The four third flip-flops FF3 may generate 4 bits Q[11:8] of the output data Q based on a third local clock LC3. The pre-evaluator PE3 may generate a second ripple carry CA2 based on the up signal UP and 4 bits Q[10:7] of the output data Q. The local clock selector LCS3 may generate the third local clock LC3 and the third carry input CI3 based on the second ripple carry CA2 and the second carry input CI2. The fourth segment SEG4 may include four fourth flip-flops FF4, a pre-evaluator PE4, and a local clock selector LCS4. The four fourth flip-flops FF4 may generate 4 bits Q[15:12] of the output data Q based on the fourth local clock LC4. The pre-evaluator PE4 may generate a third ripple carry CA3 based on the up signal UP and 4 bits Q[14:11] of the output data Q. The local clock selector LCS4 may generate the fourth local clock LC4 based on the third ripple carry CA3 and the third carry input CI3.

Figure 3A:
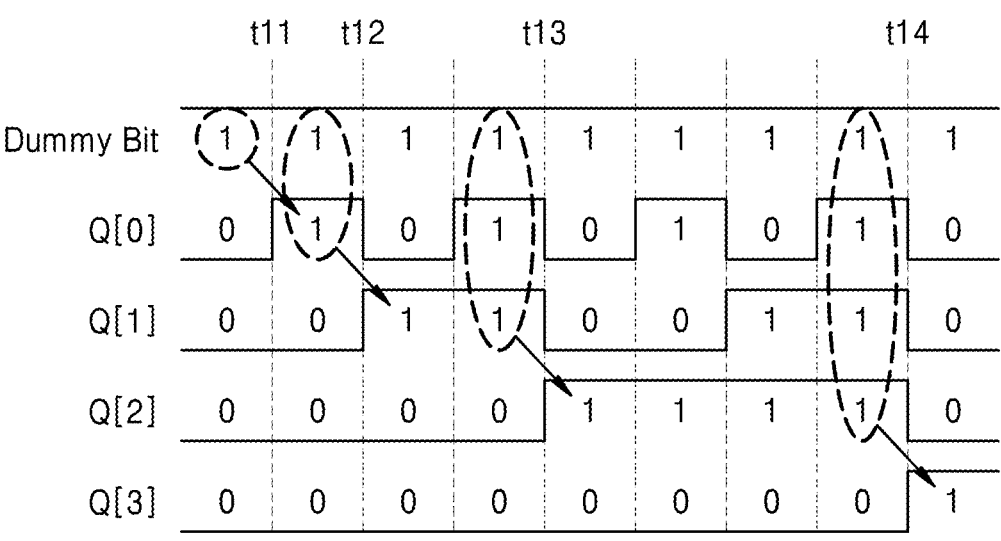
FIGS. 3A and 3B are timing diagrams illustrating an operation of a counter, according to example embodiments.
Figure 3B:
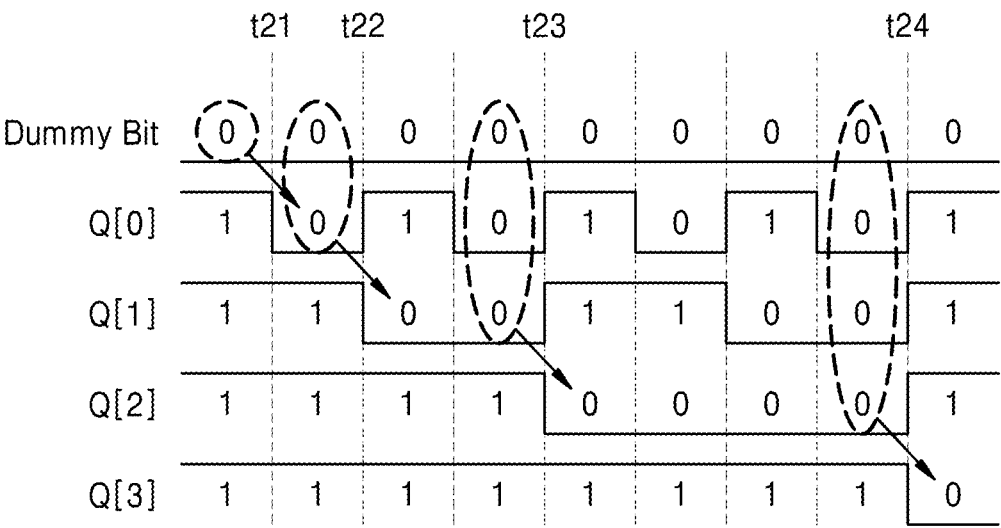

FIGS. 3A and 3B are timing diagrams illustrating an operation of a counter, according to example embodiments. For example, the timing diagram of FIG. 3A shows 4 bits Q[3:0] of the output data Q in up counting, and the timing diagram of FIG. 3B shows 4 bits Q[3:0] of the output data Q in down counting.

Referring to FIG. 3A, assuming that there is a dummy bit that is "1" below the LSB of the output data Q, i.e., Q[0], an upper bit may transition from 0 to 1 when the lower bits including the dummy bit are all 1. For example, at time t11, Q[0] may transition to 1 due to a dummy bit that is 1, and at time t12, Q[1] may transition to 1 due to the dummy bit and Q[0] that are 1. Furthermore, at time t13, Q[2] may transition to 1 due to the dummy bit and Q[1:0] that are 1, and at time t14, Q[3] may transition to 1 due to the dummy bit and Q[2:0] that are 1.

Referring to FIG. 3B, assuming that there is a dummy bit that is 0 below the LSB of the output data (Q), i.e., Q[0], an upper bit may transition from 1 to 0 when the lower bits including the dummy bit are all 0. For example, at time t21, Q[0] may transition to 0 due to a dummy bit that is 0, and at time t22, Q[1] may transition to 0 due to the dummy bit and Q[0] that are 0. Furthermore, at time t23, Q[2] may transition to 0 due to the dummy bit and Q[1:0] that are 0, and at time t24, Q[3] may transition to 0 due to the dummy bit and Q[2:0] that are 0.

Based on the timing diagrams of FIGS. 3A and 3B, a bidirectional counter may be implemented by adding only a multiplexer that selects the output data Q or the inverted output data QB in response to the up signal UP, as described below with reference to FIG. 4. For example, the multiplexer may select the output data Q in response to the activated up signal UP, while selecting the inverted output data QB in response to the deactivated up signal UP.

Figure 4:
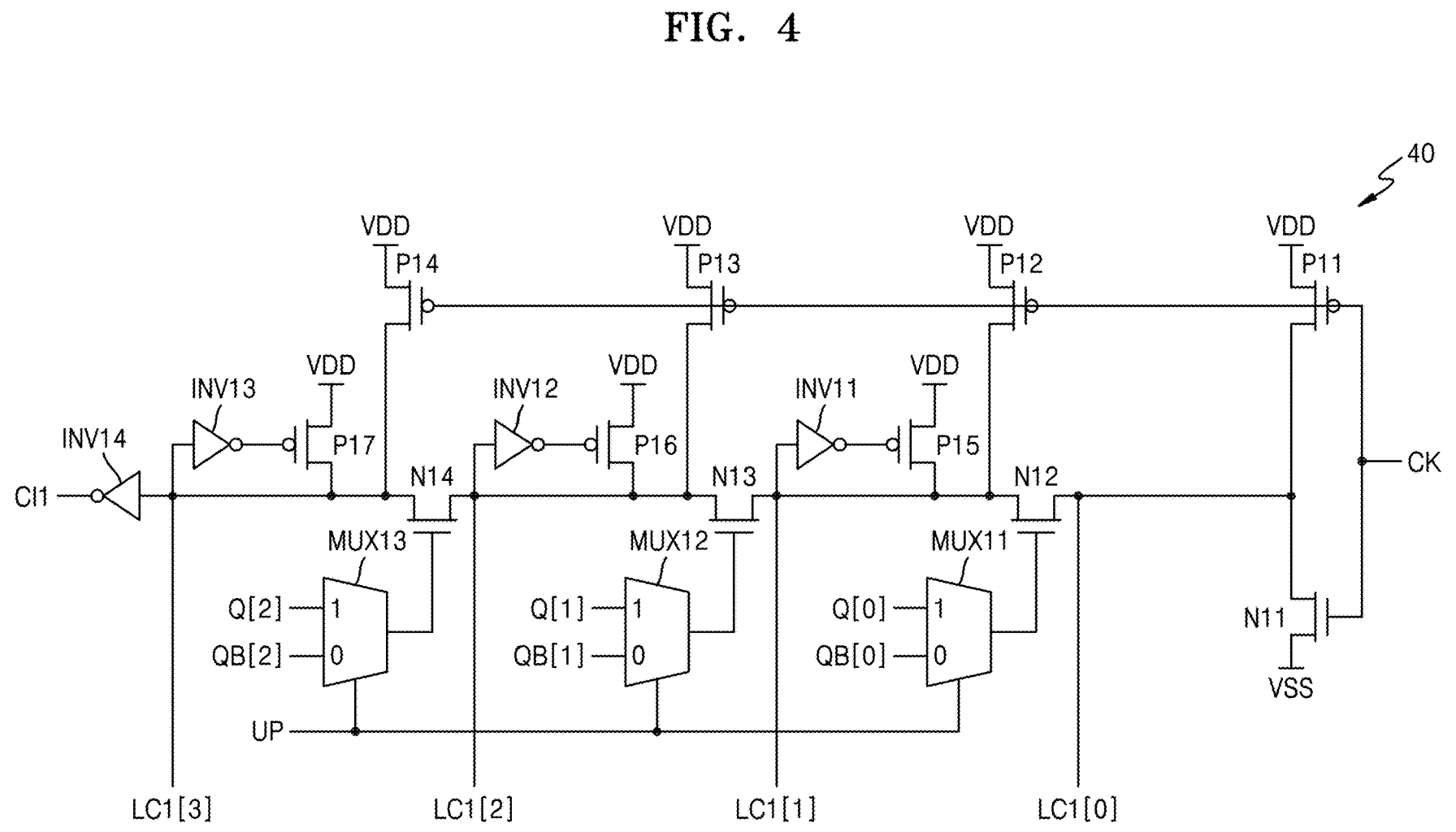

FIG. 4 is a circuit diagram illustrating a local clock generator 40 according to one or more example embodiments. For example, the circuit diagram of FIG. 4 shows an example of the local clock generator LCG of FIG. 2. As described above with reference to FIG. 2, the local clock generator 40 may receive an input clock CK and an up signal UP and generate a first local clock LC1 that is 4 bits. As shown in FIG. 4, the local clock generator 40 may include first to seventh p-channel field effect transistors (PFETs) P11 to P17, first to fourth n-channel FETs (NFETs) N11 to N14, first to fourth inverters INV11 to INV14, and first to third multiplexers MUX11 to MUX13.

The first to fourth PFETs P11 to P14 may, in response to the deactivated input clock CK, precharge output nodes at which the first local clock LC1 is generated. For example, as shown in FIG. 4, the first PFET P11 may precharge (or pull up) a first bit LC1[0] of the first local clock LC1 to 1 in response to the input clock CK that is 0. The second PFET P12 may precharge (or pull up) a second bit LC1[1] of the first local clock LC1 to 1 in response to the input clock CK that is 0. The third PFET P13 may precharge (or pull up) a third bit LC1[2] of the first local clock LC1 to 1 in response to the input clock CK that is 0. The fourth PFET P14 may precharge (or pull up) a fourth bit LC1[3] of the first local clock LC1 to 1 in response to the input clock CK that is 0.

The first to fourth NFETs N11 to N14 may propagate discharge of the output nodes at which the first local clock LC1 is generated, in response to the activated input clock CK and outputs of the first to third multiplexers MUX11 to MUX13. For example, as shown in FIG. 4, the first NFET N11 may discharge (or pull down) the first bit LC1[0] of the first local clock LC1 to 0 in response to the input clock CK that is 1. When the first bit LC1[0] of the first local clock LC1 is 0, the second NFET N12 may discharge (or pull down) the second bit LC1[1] of the first local clock LC1 in response to an activated output of the first multiplexer MUX11. When the second bit LC1[1] of the first local clock LC1 is 0, the third NFET N13 may discharge (or pull down) the third bit LC1[2] of the first local clock LC1 in response to an activated output of the second multiplexer MUX12. When the third bit LC1[2] of the first local clock LC1 is 0, the fourth NFET N14 may discharge (or pull down) the fourth bit LC1[3] of the first local clock LC1 in response to an activated output of the third multiplexer MUX13.

The first to third multiplexers MUX11 to MUX13 may select output data Q or inverted output data QB according to the up signal UP. For example, as shown in FIG. 4, the first multiplexer MUX11 may select one of a first bit Q[0] of the output data Q and a first bit QB[0] of the inverted output data QB according to the up signal UP, and generate an output corresponding to the selected bit. The second multiplexer MUX12 may select one of a second bit Q[1] of the output data Q and a second bit QB [1] of the inverted output data QB according to the up signal UP, and generate an output corresponding to the selected bit. The third multiplexer MUX13 may select one of a third bit Q[2] of the output data Q and a third bit QB[2] of the inverted output data QB according to the up signal UP, and generate an output corresponding to the selected bit.

The fifth to seventh PFETs P15 to P17 and the first to third inverters INV11 to INV13 may correspond to three latches. For example, the fifth PFET P15 and the first inverter INV11 may latch the second bit LC1[1] of the first local clock LC1. The sixth PFET P16 and the second inverter INV12 may latch the third bit LC1[2] of the first local clock LC1. The seventh PFET P17 and the third inverter INV13 may latch the fourth bit LC1[3] of the first local clock LC1. The fourth inverter INV14 may generate a first carry input CI1 by inverting the fourth bit LC1[3] of the first local clock LC1. In some embodiments, each of the first to fourth inverters INV11 to INV14 may include a PFET and an NFET connected in series between a node to which a positive supply voltage VDD is applied and a node to which a negative supply voltage VSS is applied.

Figure 5A:
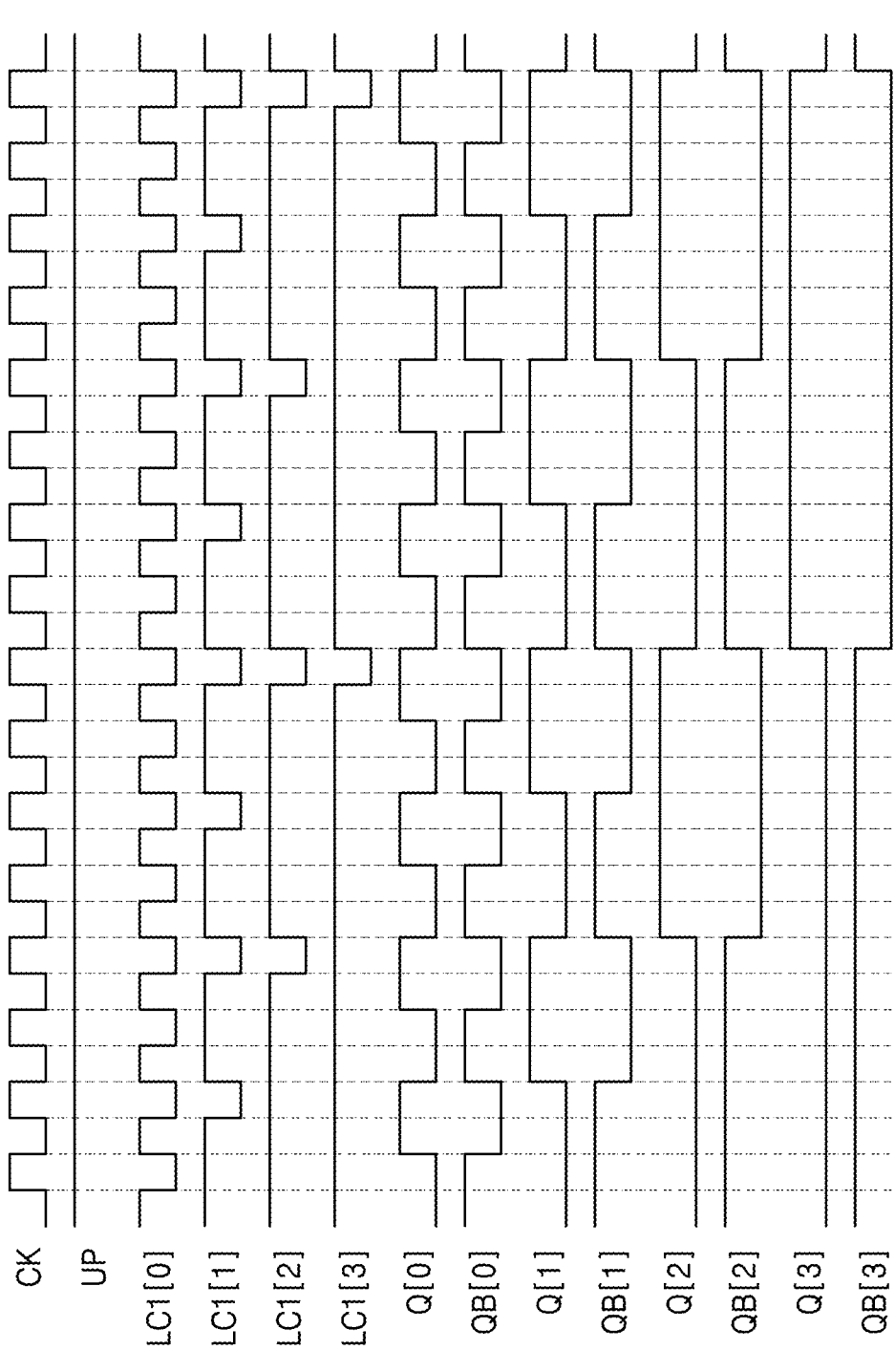
FIGS. 5A and 5B are timing diagrams illustrating examples of operations of a first segment of a counter, according to example embodiments.
Figure 5B:
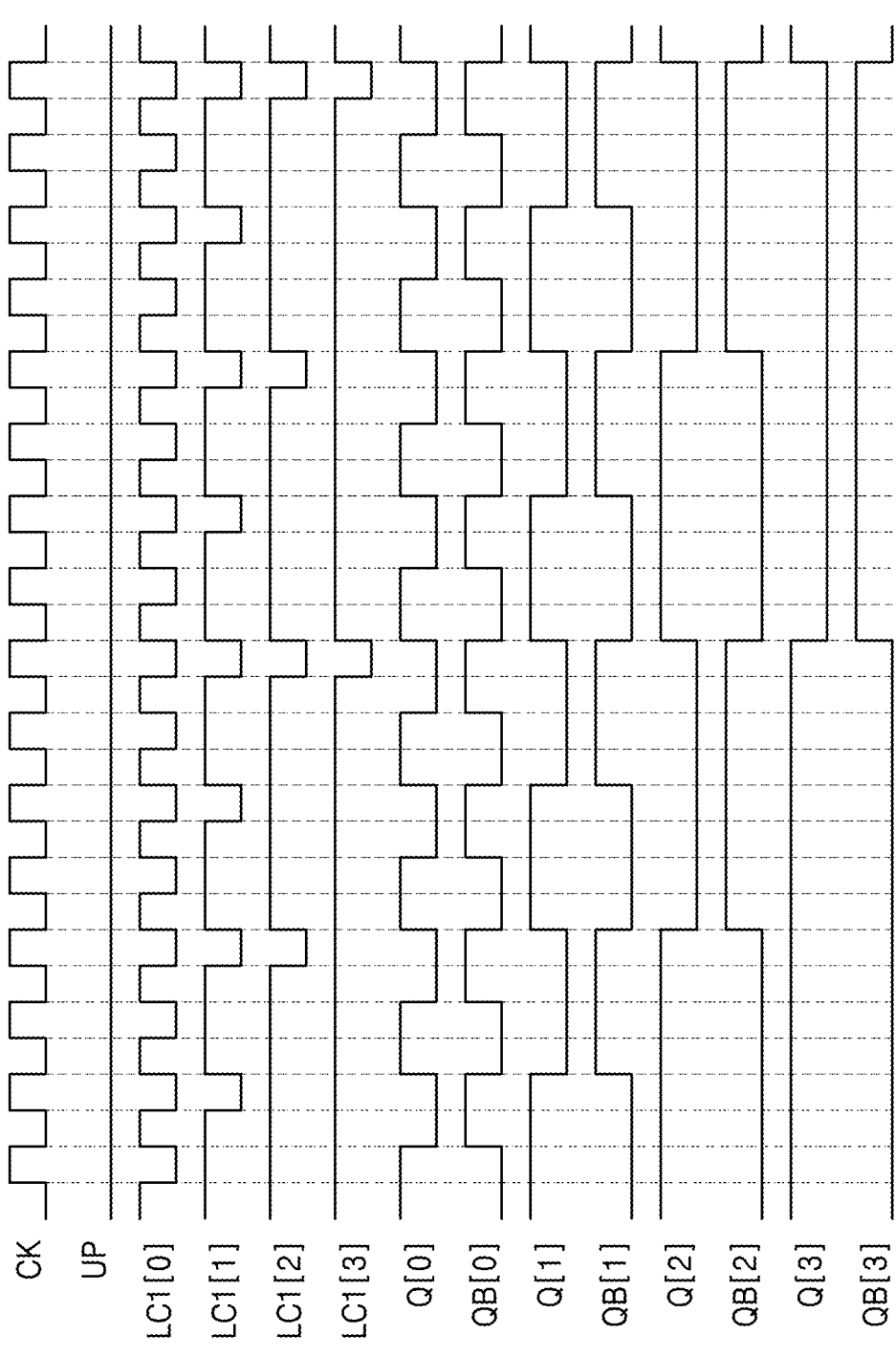

FIGS. 5A and 5B are timing diagrams illustrating examples of operations of a first segment SEG1, according to example embodiments. For example, the timing diagram of FIG. 5A shows an operation of the first segment SEG1 in up counting, and the timing diagram of FIG. 5B shows an operation of the first segment SEG1 in down counting. In some embodiments, the operations of FIGS. 5A and 5B may be performed by the first segment SEG1 including the local clock generator 40 of FIG. 4. The operations of FIGS. 5A and 5B are described in conjunction with FIG. 4.

Referring to FIG. 5A, the up signal UP may be 1, and the local clock generator 40 may operate based on the 3 bits Q[2:0] of the output data Q. As shown in FIG. 5A, 4 bits LC1[3:0] of the first local clock LC1 may be all 1 when the input clock CK is 0. The first bit LC1[0] of the first local clock LC1 may be 1 when the input clock CK is 0. The second bit LC1[1] of the first local clock LC1 may be 0 when the first bit LC1[0] of the first local clock LC1 is 0 and the first bit Q[0] of the output data Q is 1. The third bit LC1[2] of the first local clock LC1 may be 0 when the lower 2 bits LC1[1:0] of the first local clock LC1 are 0 and the lower 2 bits Q[1:0] of the output data Q are 1. The fourth bit LC1[3] of the first local clock LC1 may be 0 when the lower 3 bits LC1[2:0] of the first local clock LC1 are 0 and the lower 3 bits Q[2:0] of the output data Q are 1. The 4 bits Q[3:0] of the output data Q may be respectively toggled on rising edges of the 4 bits LC1[3:0] of the first local clock LC1.

Referring to FIG. 5B, the up signal UP may be 0, and the local clock generator 40 may operate based on the 3 bits QB[2:0] of the inverted output data QB. As shown in FIG. 5B, the 4 bits LC1[3:0] of the first local clock LC1 may be all 1 when the input clock CK is 0. The first bit LC1[0] of the first local clock LC1 may be 1 when the input clock CK is 0. The second bit LC1[1] of the first local clock LC1 may be 0 when the first bit LC1[0] of the first local clock LC1 is 0 and the first bit QB[0] of the inverted output data QB is 1. The third bit LC1[2] of the first local clock LC1 may be 0 when the lower 2 bits LC1[1:0] of the first local clock LC1 are 0 and the lower 2 bits QB[1:0] of the inverted output data QB are 1. The fourth bit LC1[3] of the first local clock LC1 may be 0 when the lower 3 bits LC1[2:0] of the first local clock LC1 are 0 and the lower 3 bits QB[2:0] of the inverted output data QB are 1. The 4 bits Q[3:0] of the output data Q may be respectively toggled on the rising edges of the 4 bits LC1[3:0] of the first local clock LC1.

Figure 6:
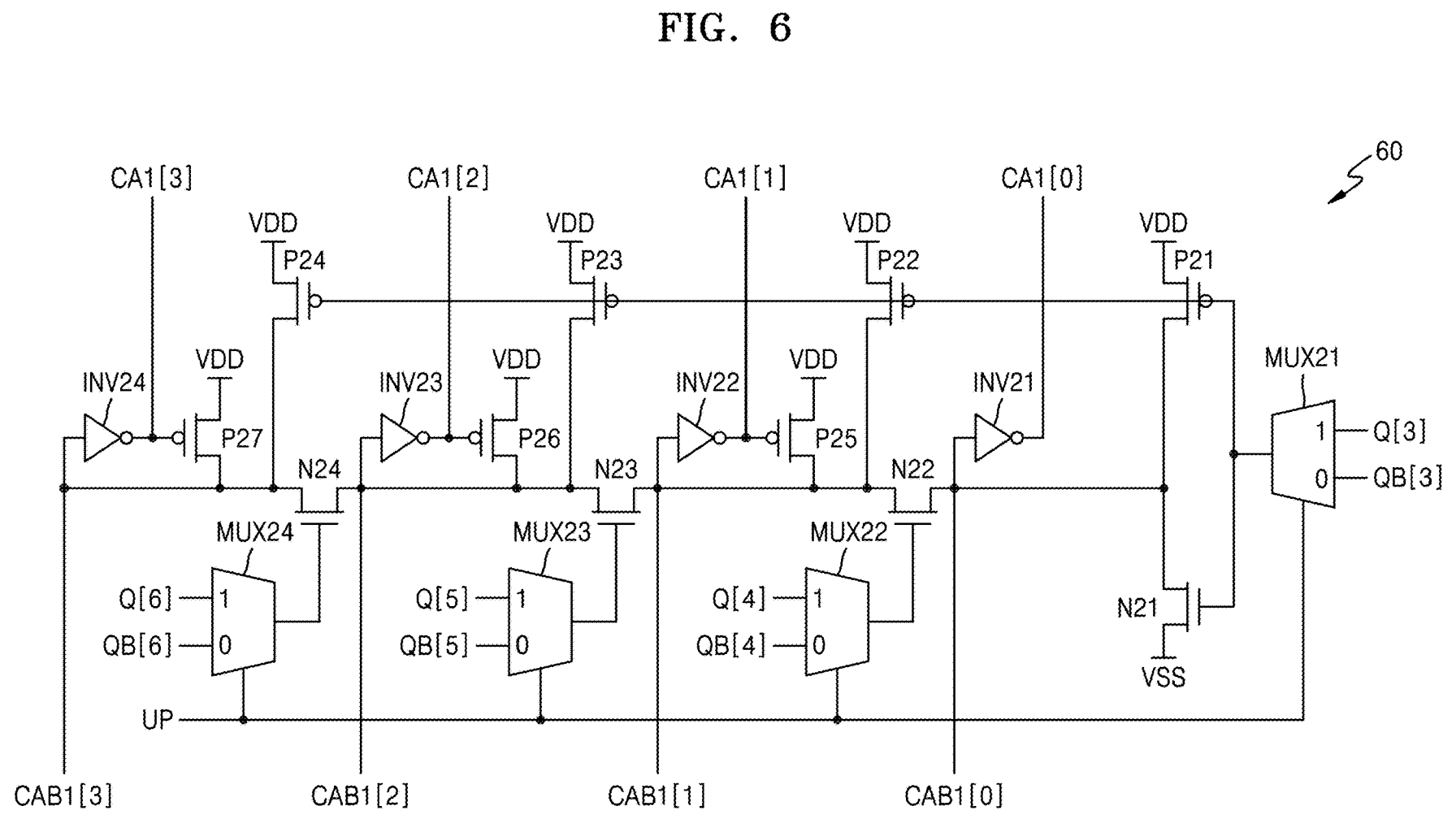

FIG. 6 is a circuit diagram illustrating a pre-evaluator 60 according to one or more example embodiments. For example, the circuit diagram of FIG. 6 shows an example of the pre-evaluator PE2 of FIG. 2, and the pre-evaluators PE2 to PE4 included in the second to fourth segments SEG2 to SEG4 of FIG. 2 may have the same structure as that illustrated in FIG. 6. As described above with reference to FIG. 2, the pre-evaluator 60 may receive an up signal UP and 4 bits Q[6:3] of output data Q and generate a first ripple carry CA1[3:0] that is 4 bits. As shown in FIG. 6, the pre-evaluator 60 may include first to seventh PFETs P21 to P27, first to fourth NFETs N21 to N24, first to fourth inverters INV21 to INV24, and first to fourth multiplexers MUX21 to MUX24.

In response to a deactivated output of the first multiplexer MUX21, the first to fourth PFETs P21 to P24 may precharge output nodes where a first inverted ripple carry CAB1 is generated. For example, as shown in FIG. 6, the first PFET P21 may precharge (or pull up) a first bit CAB1[0] of the first inverted ripple carry CAB1 to 1 in response to an output of the first multiplexer MUX21 that is 0. The second PFET P22 may precharge (or pull up) a second bit CAB1[1] of the first inverted ripple carry CAB1 to 1 in response to the output of the first multiplexer MUX21 that is 0. The third PFET P23 may precharge (or pull up) a third bit CAB1[2] of the first inverted ripple carry CAB1 to 1 in response to the output of the first multiplexer MUX21 that is 0. The fourth PFET P24 may precharge (or pull up) a fourth bit CAB1[3] of the first inverted ripple carry CAB1 to 1 in response to the output of the first multiplexer MUX21 that is 0.

The first to fourth NFETs N21 to N24 may propagate discharge of the output nodes where the first inverted ripple carry CAB1 is generated, in response to activated outputs of the first to fourth multiplexers MUX21 to MUX24. For example, as shown in FIG. 6, the first NFET N21 may discharge (or pull down) the first bit CAB1[0] of the first inverted ripple carry CAB1 to 0 in response to the output of the first multiplexer MUX21 that is 1. When the first bit CAB1[0] of the first inverted ripple carry CAB1 is 0, the second NFET N22 may discharge (or pull down) the second bit CAB1[1] of the first inverted ripple carry CAB1 in response to the activated output of the second multiplexer MUX22. When the second bit CAB1[1] of the first inverted ripple carry CAB1 is 0, the third NFET N23 may discharge (or pull down) the third bit CAB1[2] of the first inverted ripple carry CAB1 in response to the activated output of the third multiplexer MUX23. When the third bit CAB1[2] of the first inverted ripple carry CAB1 is 0, the fourth NFET N24 may discharge (or pull down) the fourth bit CAB1[3] of the first inverted ripple carry CAB1 in response to the activated output of the fourth multiplexer MUX24.

The first to fourth multiplexers MUX21 to MUX24 may select output data Q or inverted output data QB according to the up signal UP. For example, as shown in FIG. 6, the first multiplexer MUX21 may select one of a fourth bit Q[3] of the output data Q and a fourth bit QB[3] of the inverted output data QB according to the up signal UP, and generate an output corresponding to the selected bit. The second multiplexer MUX22 may select one of a fifth bit Q[4] of the output data Q and a fifth bit QB[4] of the inverted output data QB according to the up signal UP, and generate an output corresponding to the selected bit. The third multiplexer MUX23 may select one of a sixth bit Q[5] of the output data Q and a sixth bit QB[5] of the inverted output data QB according to the up signal UP, and generate an output corresponding to the selected bit. The fourth multiplexer MUX24 may select one of a seventh bit Q[6] of the output data Q and a seventh bit QB[6] of the inverted output data QB according to the up signal UP, and generate an output corresponding to the selected bit.

The fifth to seventh PFETs P25 to P27 and the second to fourth inverters INV22 to INV24 may correspond to three latches. For example, the fifth PFET P25 and the second inverter INV22 may latch the second bit CAB1 [1] of the first inverted ripple carry CAB1. The sixth PFET P26 and the third inverter INV23 may latch the third bit CAB1[2] of the first inverted ripple carry CAB1. The seventh PFET P27 and the fourth inverter INV24 may latch the fourth bit CAB1[3] of the first inversion ripple carry CAB1. The fourth inverter INV24 may generate the fourth bit CA1[3] of the first ripple carry CA1 by inverting the fourth bit CAB1 [3] of the first inverted ripple carry CAB1.

The first to fourth inverters INV21 to INV24 may generate the first ripple carry CA1 from the first inverted ripple carry CAB1. In some embodiments, each of the first to fourth inverters INV21 to INV24 may include a PFET and an NFET connected in series between a node to which a positive supply voltage VDD is applied and a node to which a negative supply voltage VSS is applied.

Figure 7A:
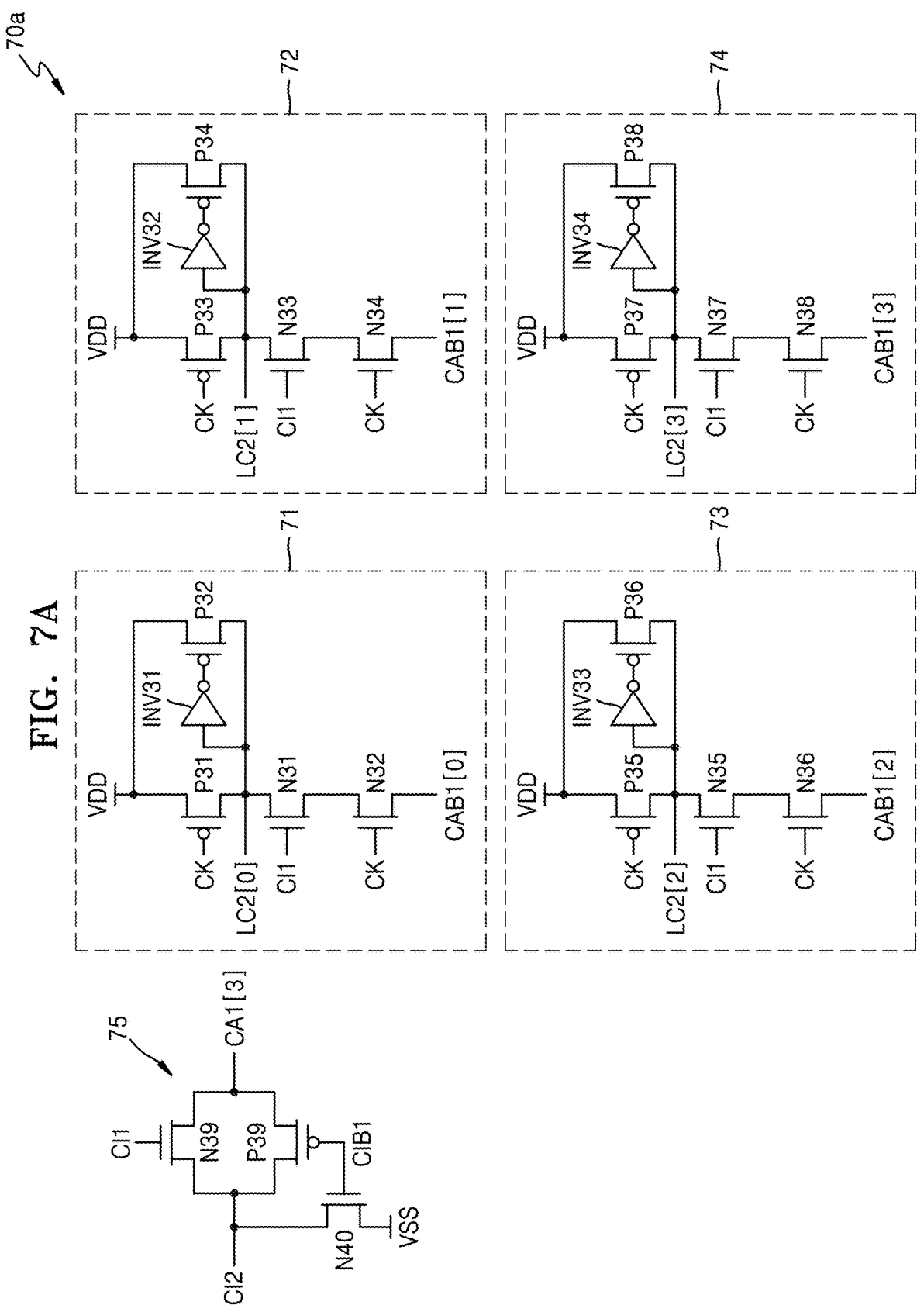
FIGS. 7A and 7B are circuit diagrams illustrating examples of a local clock selector according to example embodiments.
Figure 7B:
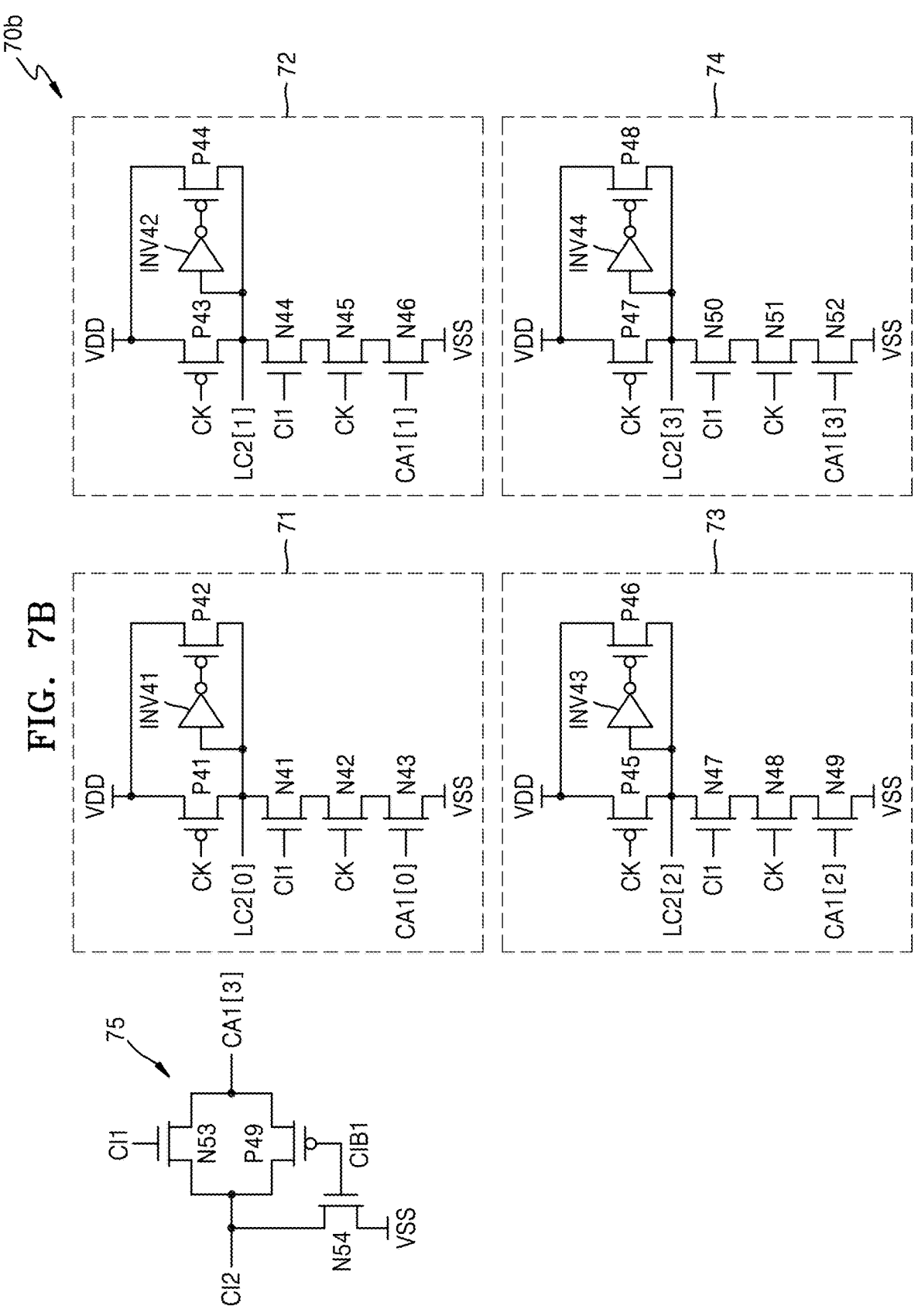

FIGS. 7A and 7B are circuit diagrams illustrating examples of a local clock selector according to example embodiments. For example, the circuit diagrams of FIGS. 7A and 7B illustrate examples of the local clock selector LCS2 of FIG. 2, and the local clock selectors LCS2 to LCS4 respectively included in the second to fourth segments SEG2 to SEG4 of FIG. 2 may each have the same structure. As described above with reference to FIG. 2, local clock selectors 70a and 70b may each generate a second local clock LC2 and a second carry input CI2 based on a first ripple carry CA1 and a first carry input CI1.

Referring to FIG. 7A, the local clock selector 70a may include first to fourth unit circuits 71 to 74 and a carry output circuit 75. The first to fourth unit circuits 71 to 74 may each have the same structure and respectively generate 4 bits of the second local clock LC2. The first unit circuit 71 may include a first PFET P31, a second PFET P32, a first NFET N31, a second NFET N32, and a first inverter INV31. The first PFET P31 and the second PFET P32 may be connected parallel to each other between a node to which the positive supply voltage VDD is applied and an output node to which a first bit LC2[0] of the second local clock LC2 is output. The first PFET P31 may receive the input clock CK. The second PFET P32 may form a latch with the first inverter INV31 and latch the first bit LC2[0] of the second local clock LC2. The first NFET N31 and the second NFET N32 may be connected in series with each other between the output node to which the first bit LC2[0] of the second local clock LC2 is output and a node to which a first bit CAB1[0] of a first inverted ripple carry CAB1 is applied, and respectively receive the first carry input CI1 and the input clock CK. In some embodiments, the first NFET N31 and the second NFET N32 may be connected in series with each other in a different order than shown in FIG. 7A.

The second unit circuit 72 may include a third PFET P33, a fourth PFET P34, a third NFET N33, a fourth NFET N34, and a second inverter INV32. The third PFET P33 and the fourth PFET P34 may be connected parallel to each other between a node to which the positive supply voltage VDD is applied and an output node to which a second bit LC2[1]

of the second local clock LC2 is output. The third PFET P33 may receive the input clock CK. The fourth PFET P34 may form a latch with the second inverter INV32 and latch the second bit LC2[1] of the second local clock LC2. The third NFET N33 and the fourth NFET N34 may be connected in series with each other between the output node to which the second bit LC2[1] of the second local clock LC2 is output and a node to which a second bit CAB1[1] of the first inverted ripple carry CAB1 is applied, and respectively receive the first carry input CI1 and the input clock CK. In some embodiments, the third NFET N33 and the fourth NFET N34 may be connected in series with each other in a different order than shown in FIG. 7A.

The third unit circuit 73 may include a fifth PFET P35, a sixth PFET P36, a fifth NFET N35, a sixth NFET N36, and a third inverter INV33. The fifth PFET P35 and the sixth PFET P36 may be connected parallel to each other between a node to which the positive supply voltage VDD is applied and an output node to which a third bit LC2[2] of the second local clock LC2 is output. The fifth PFET P35 may receive the input clock CK. The sixth PFET P36 may form a latch with the third inverter INV33 and latch the third bit LC2[2] of the second local clock LC2. The fifth NFET N35 and the sixth NFET N36 may be connected in series with each other between the output node to which the third bit LC2[2] of the second local clock LC2 is output and a node to which a third bit CAB1[2] of the first inverted ripple carry CAB1 is applied, and respectively receive the first carry input CI1 and the input clock CK. In some embodiments, the fifth NFET N35 and the sixth NFET N36 may be connected in series with each other in a different order than shown in FIG. 7A.

The fourth unit circuit 74 may include a seventh PFET P37, an eighth PFET P38, a seventh NFET N37, an eighth NFET N38, and a fourth inverter INV34. The seventh PFET P37 and the eighth PFET P38 may be connected parallel to each other between a node to which the positive supply voltage VDD is applied and an output node to which a fourth bit LC2[3] of the second local clock LC2 is output. The seventh PFET P37 may receive the input clock CK. The eighth PFET P38 may form a latch with the fourth inverter INV34 and latch the fourth bit LC2[3] of the second local clock LC2. The seventh NFET N37 and the eighth NFET N38 may be connected in series with each other between the output node to which the fourth bit LC2[3] of the second local clock LC2 is output and a node to which a fourth bit CAB1[3] of the first inverted ripple carry CAB1 is applied, and respectively receive the first carry input CI1 and the input clock CK. In some embodiments, the seventh NFET N37 and the eighth NFET N38 may be connected in series with each other in a different order than shown in FIG. 7A.

The carry output circuit 75 may include a ninth PFET P39, a ninth NFET N39, and a tenth NFET N40. The ninth PFET P39 and the ninth NFET N39 may be connected parallel to each other and respectively receive a first inverted carry input CIB1 and the first carry input CI1. The tenth NFET N40 may be connected between a node where the second carry input CI2 is generated and a node where the negative supply voltage VSS is applied, and receive the first inverted carry input CIB1. Accordingly, when the first carry input CI1 is 0, the second carry input CI2 may be equal to a fourth bit CA1[3] of the first ripple carry CA1, while when the first carry input CI1 is 1, the second carry input CI2 may be 0.

Referring to FIG. 7B, the local clock selector 70b may include first to fourth unit circuits 71 to 74 and a carry output circuit 75. The first to fourth unit circuits 71 to 74 may each have the same structure and respectively generate 4 bits of the second local clock LC2. The first unit circuit 71 may include a first PFET P41, a second PFET P42, first to third NFETs N41 to N43, and a first inverter INV41. The first PFET P41 and the second PFET P42 may be connected parallel to each other between a node to which the positive supply voltage VDD is applied and an output node to which the first bit LC2[0] of the second local clock LC2 is output. The first PFET P41 may receive the input clock CK. The second PFET P42 may form a latch with the first inverter INV41 and latch the first bit LC2[0] of the second local clock LC2. The first to third NFETs N41 to N43 may be connected in series with one another between the output node to which the first bit LC2[0] of the second local clock LC2 is output and a node to which the negative supply voltage VSS is applied, and respectively receive the first carry input CI1, the input clock CK, and the first bit CA1[0] of the first ripple carry CA1. In some embodiments, the first to third NFETs N41 to N43 may be connected in series with one another in a different order than shown in FIG. 7B.

The second unit circuit 72 may include a third PFET P43, a fourth PFET P44, fourth to sixth NFETs N44 to N46, and a second inverter INV42. The third PFET P43 and the fourth PFET P44 may be connected parallel to each other between a node to which the positive supply voltage VDD is applied and an output node to which the second bit LC2[1] of the second local clock LC2 is output. The third PFET P43 may receive the input clock CK. The fourth PFET P44 may form a latch with the second inverter INV42 and latch the second bit LC2[1] of the second local clock LC2. The fourth to sixth NFETs N44 to N46 may be connected in series with one another between the output node to which the second bit LC2[1] of the second local clock LC2 is output and a node to which the negative supply voltage VSS is applied, and respectively receive the first carry input CI1, the input clock CK, and the second bit CA1[1] of the first ripple carry CA1. In some embodiments, the fourth to sixth NFETs N44 to N46 may be connected in series with one another in a different order than shown in FIG. 7B.

The third unit circuit 73 may include a fifth PFET P45, a sixth PFET P46, seventh to ninth NFETs N47 to N49, and a third inverter INV43. The fifth PFET P45 and the sixth PFET P46 may be connected parallel to each other between a node to which the positive supply voltage VDD is applied and an output node to which the third bit LC2[2] of the second local clock LC2 is output. The fifth PFET P45 may receive the input clock CK. The sixth PFET P46 may form a latch with the third inverter INV43 and latch the third bit LC2[2] of the second local clock LC2. The seventh to ninth NFETs N47 to N49 may be connected in series with one another between the output node to which the third bit LC2[2] of the second local clock LC2 is output and a node to which the negative supply voltage VSS is applied, and respectively receive the first carry input CI1, the input clock CK, and the third bit CA1[2] of the first ripple carry CA1. In some embodiments, the seventh to ninth NFETs N47 to N49 may be connected in series with one another in a different order than shown in FIG. 7B.

The fourth unit circuit 74 may include a seventh PFET P47, an eighth PFET P48, tenth to twelfth NFETs N50 to N52, and a fourth inverter INV44. The seventh PFET P47 and the eighth PFET P48 may be connected parallel to each other between a node to which the positive supply voltage VDD is applied and an output node to which the fourth bit LC2[3] of the second local clock LC2 is output. The seventh PFET P47 may receive the input clock CK. The eighth PFET P48 may form a latch with the fourth inverter INV44 and latch the fourth bit LC2[3] of the second local clock LC2. The tenth to twelfth NFETs N50 to N52 may be connected in series with one another between the output node to which the fourth bit LC2[3] of the second local clock LC2 is output and a node to which the negative supply voltage VSS is applied, and respectively receive the first carry input CI1, the input clock CK, and the fourth bit CA1[3] of the first ripple carry CA1. In some embodiments, the tenth to twelfth NFETs N50 to N52 may be connected in series with one another in a different order than shown in FIG. 7B.

The carry output circuit 75 may include a ninth PFET P49, a thirteenth NFET N53, and a fourteenth NFET N54. The ninth PFET P49 and the thirteenth NFET N53 may be connected parallel to each other and receive the first inverted carry input CIB1 and the first carry input CI1, respectively. The fourteenth NFET N54 may be connected between a node where the second carry input CI2 is generated and a node where the negative supply voltage VSS is applied, and receive the first inverted carry input CIB1. Accordingly, when the first carry input CI1 is 0, the second carry input CI2 may be equal to the fourth bit CA1[3] of the first ripple carry CA1, while when the first carry input CI1 is 1, the second carry input CI2 may be 0. Hereinafter, reference will be made to the local clock selector 70b of FIG. 7B, but it is noted that embodiments are not limited thereto.

Figure 8A:
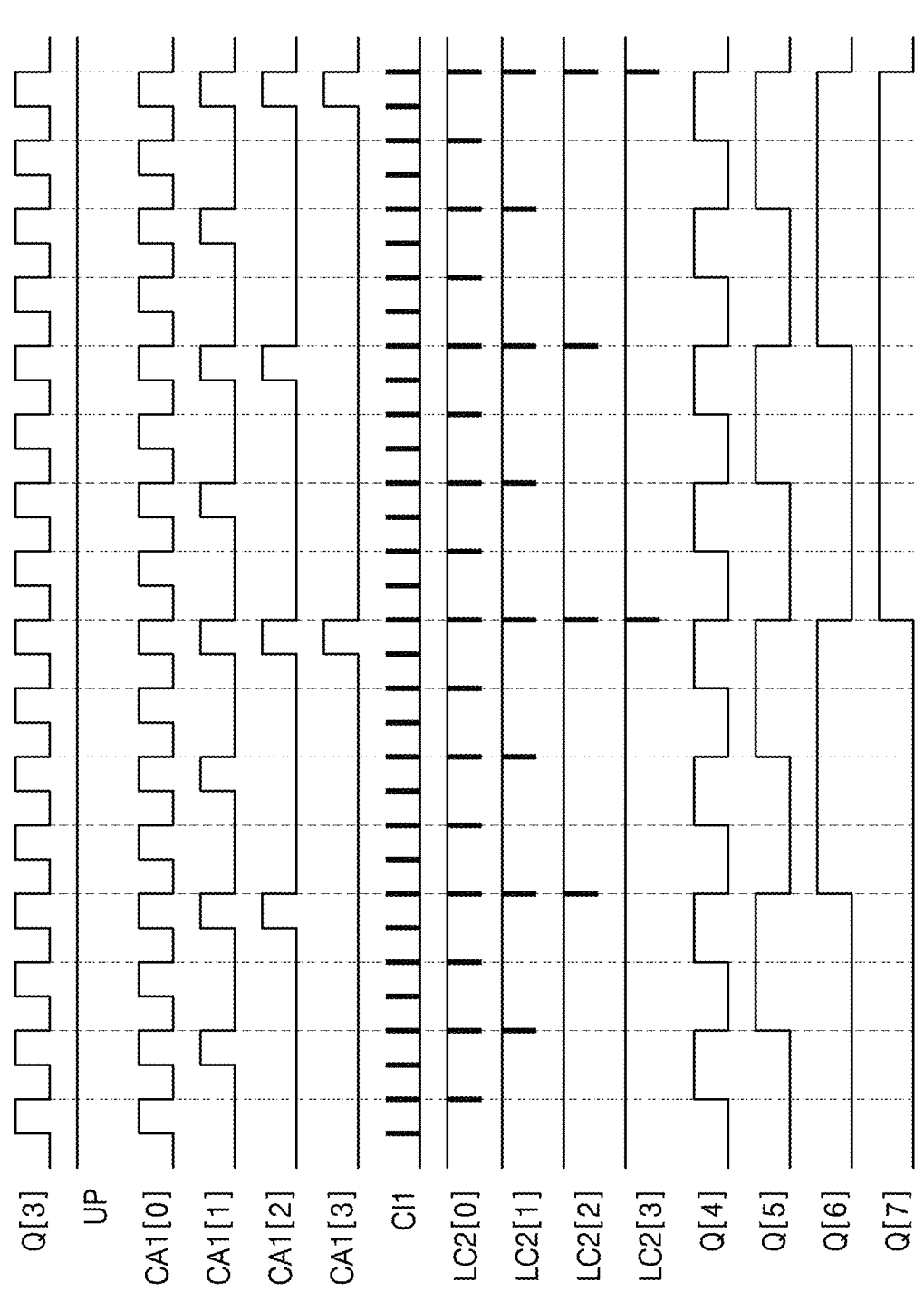
FIGS. 8A and 8B are timing diagrams illustrating examples of operations of a second segment of a counter, according to example embodiments.
Figure 8B:
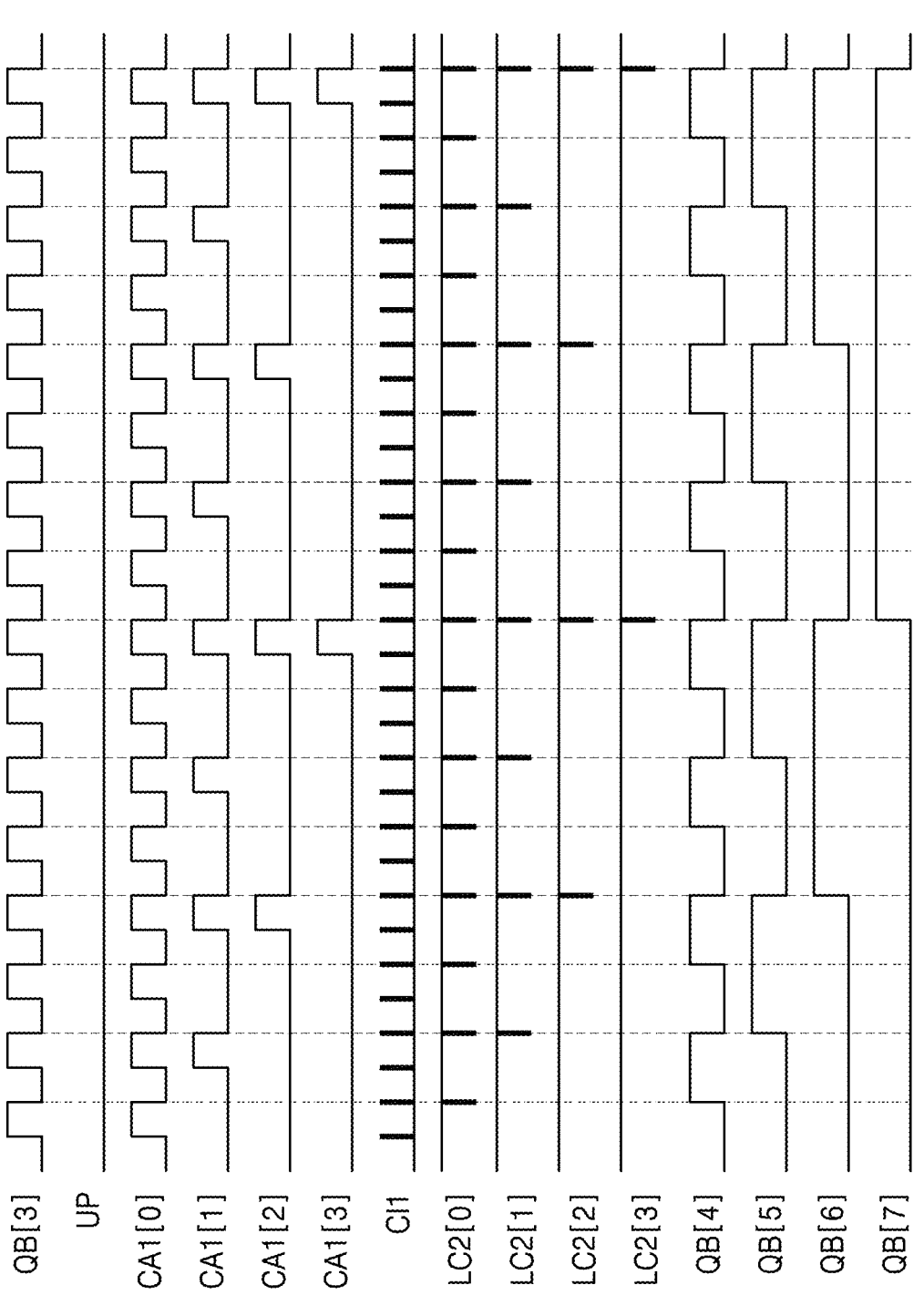

FIGS. 8A and 8B are timing diagrams illustrating examples of operations of a second segment SEG2, according to example embodiments. For example, the timing diagram of FIG. 8A shows an operation of the second segment SEG2 in up counting, and the timing diagram of FIG. 8B shows an operation of the second segment SEG2 in down counting. In some embodiments, the operations of FIGS. 8A and 8B may be performed by the second segment SEG2, which includes the pre-evaluator 60 of FIG. 6 and the local clock selector 70b of FIG. 7B. Hereinafter, the operations illustrated in FIGS. 8A and 8B are described in conjunction with FIGS. 2, 6, and 7B.

Referring to FIG. 8A, the up signal UP may be 1, and the pre-evaluator 60 may operate based on the up signal UP and the 4 bits Q[6:3] of the output data Q. As described above with reference to FIG. 5A, the fourth bit Q[3] of the output data Q may be oscillated by the local clock generator LCG with a period corresponding to 16 times a period of the input clock CK. The 4 bits CA1[3:0] of the first ripple carry CA1 may be 0 due to the 4 bits CAB1[3:0] of the first inverted ripple carry CAB1, which are pulled up when the fourth bit Q[3] of the output data Q is 0.

The first bit CA1[0] of the first ripple carry CA1 may be 1 when the fourth bit Q[3] of the output data Q is 1. The second bit CA1[1] of the first ripple carry CA1 may be 1 when the first bit CAB1[0] of the first inverted ripple carry CAB1 is 0 and the fifth bit Q[4] of the output data Q is 1. The third bit CA1[2] of the first ripple carry CA1 may be 1 when the second bit CAB1[1] of the first inverted ripple carry CAB1 is 0 and the sixth bit Q[5] of the output data Q is 1. The fourth bit CA1[3] may be 1 when the third bit CAB1[2] of the first inverted ripple carry CAB1 is 0 and the seventh bit Q[6] of the output data Q is 1.

As shown in FIG. 8A, the first carry input CI1 may include pulses synchronized with the fourth bit Q[3] of the output data Q. The first bit LC2[0] of the second local clock LC2 may be 0 when the input clock CK, the first bit CA1[0] of the first ripple carry CA1, and the first carry input CI1 are 1. The second bit LC2[1] of the second local clock LC2 may be 0 when the input clock CK, the lower 2 bits CA1[1:0] of the first ripple carry CA1, and the first carry input CI1 are 1. The third bit LC2[2] of the second local clock LC2 may be 0 when the input clock CK, the lower 3 bits CA1[2:0] of the first ripple carry CA1, and the first carry input CI1 are 1. The fourth bit LC2[3] of the second local clock LC2 may be 0 when the input clock CK, the 4 bits CA1[3:0] of the first ripple carry CA1, and the first carry input CI1 are 1. The 4 bits Q[7:4] of the output data Q may be respectively toggled on rising edges of the 4 bits LC1[3:0] of the first local clock LC1.

Referring to FIG. 8B, the up signal UP may be 0, and the pre-evaluator 60 may operate based on the up signal UP and the 4 bits QB[6:3] of the inverted output data QB. As described above with reference to FIG. 5B, the fourth bit QB[3] of the inverted output data QB may be oscillated by the local clock generator LCG with a period corresponding to 16 times the period of the input clock CK. The 4 bits CA1[3:0] of the first ripple carry CA1 may be 0 due to the 4 bits CAB1[3:0] of the first inverted ripple carry CAB1, which are pulled up when the 4th bit QB[3] of the inverted output data QB is 0.

The first bit CA1[0] of the first ripple carry CA1 may be 1 when the fourth bit QB[3] of the inverted output data QB is 1. The second bit CA1[1] of the first ripple carry CA1 may be 1 when the first bit CAB1[0] of the first inverted ripple carry CAB1 is 0 and the fifth bit QB[4] of the inverted output data QB is 1. The third bit CA1[2] of the first ripple carry CA1 may be 1 when the second bit CAB1[1] of the first inverted ripple carry CAB1 is 0 and the sixth bit QB [5] of the inverted output data QB is 1. The fourth bit CA1[3] of the first ripple carry CA1 may be 1 when the third bit CAB1[2] of the first inverted ripple carry CAB1 is 0 and the seventh bit QB[6] of the inverted output data QB is 1.

As shown in FIG. 8B, the first carry input CI1 may include pulses synchronized with the fourth bit QB[3] of the inverted output data QB. The first bit LC2[0] of the second local clock LC2 may be 0 when the input clock CK, the first bit CA1[0] of the first ripple carry CA1, and the first carry input CI1 are 1. The second bit LC2[1] of the second local clock LC2 may be 0 when the input clock CK, the lower 2 bits CA1[1:0] of the first ripple carry CA1, and the first carry input CI1 are 1. The third bit LC2[2] of the second local clock LC2 may be 0 when the input clock CK, the lower 3 bits CA1[2:0] of the first ripple carry CA1, and the first carry input CI1 are 1. The fourth bit LC2[3] of the second local clock LC2 may be 0 when the input clock CK, the 4 bits CA1[3:0] of the first ripple carry CA1, and the first carry input CI1 are 1. The 4 bits Q[7:4] of the output data Q may be respectively toggled on rising edges of the 4 bits LC1[3:0] of the first local clock LC1.

Figure 9:
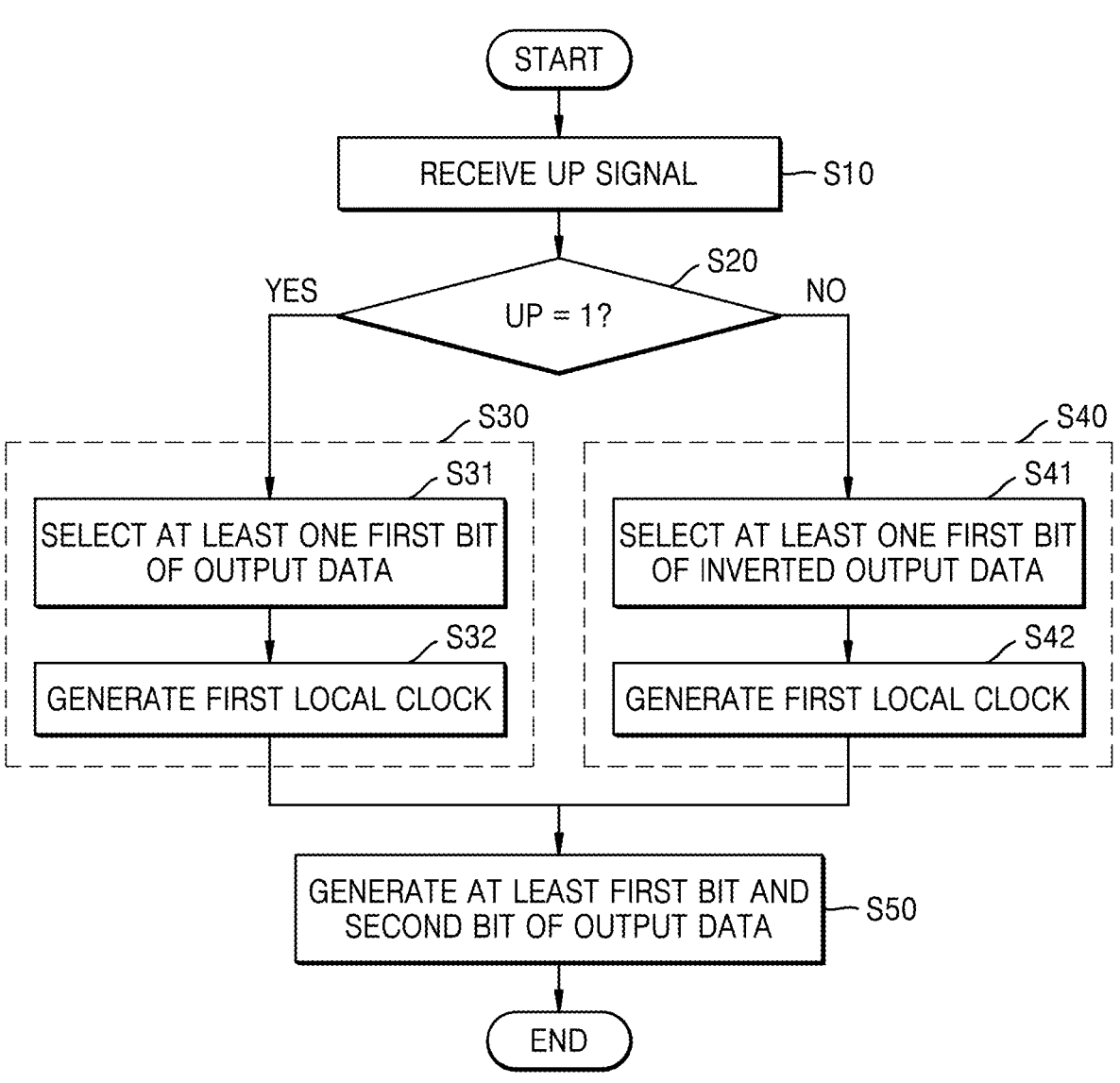
FIG. 9 is a flowchart illustrating operations of a counter, according to one or more example embodiments.

FIG. 9 is a flowchart illustrating operations of a counter, according to one or more example embodiments. Herein, the operations of FIG. 9 may be referred to as a method of generating output data Q that increases or decreases according to an input clock CK. As illustrated FIG. 9, the method of generating output data Q that increases or decreases according to the input clock CK may include a plurality of operations S10 to S50. In some embodiments, the method of FIG. 9 may be performed by the first segment SEG1 of FIG. 2 including the local clock generator 40 of FIG. 4. The method of FIG. 9 is described in conjunction with FIGS. 2 and 4.

Referring to FIG. 9, the up signal UP may be received in operation S10. The up signal UP may indicate up counting or down counting to the first segment SEG1. For example, an up signal UP that is 1 may indicate up counting, and an up signal UP that is 0 may indicate down counting. In operation S20, it may be determined whether the up signal UP is activated. For example, as shown in FIG. 9, when the up signal UP is activated, e.g., when the up signal UP is "1", operation S30 may be performed subsequently. When the up signal UP is deactivated, e.g., when the up signal UP is "0", operation S40 may be performed subsequently.

In operation S30, the first local clock LC1 may be generated based on at least one first bit of the output data Q. For example, the local clock generator 40 may generate the first local clock LC1 based on the lower 3 bits Q[2:0] of the output data Q. As illustrated in FIG. 9, operation S30 may include operations S31 and S32. In operation S31, at least one first bit of the output data Q may be selected. For example, the first to third multiplexers MUX11 to MUX13 of the local clock generator 40 may select and output the 3 bits Q[2:0] of the output data Q in response to the activated up signal UP. In operation S32, the first local clock LC1 may be generated. For example, the local clock generator 40 may pull up the first local clock LC1 to 1 based on the input clock CK that is 0, while pulling down bits of the first local clock LC1 respectively in response to the 3 bits Q[2:0] of the output data Q when the input clock CK is 1.

In operation S40, the first local clock LC1 may be generated based on at least one first bit of the inverted output data QB. For example, the local clock generator 40 may generate the first local clock LC1 based on the lower 3 bits QB[2:0] of the inverted output data QB. As illustrated in FIG. 9, operation S40 may include operations S41 and S42. In operation S41, at least one first bit of the inverted output data QB may be selected. For example, the first to third multiplexers MUX11 to MUX13 of the local clock generator 40 may select the 3 bits QB[2:0] of the inverted output data QB in response to the deactivated up signal UP and output a result corresponding to the selected 3 bits. In operation S42, the first local clock LC1 may be generated. For example, the local clock generator 40 may pull up the first local clock LC1 to 1 based on the input clock CK that is 0, while pulling down bits of the first local clock LC1 respectively according to the 3 bits QB[2:0] of the inverted output data QB when the input clock CK is 1.

In operation S50, at least one first bit and a second bit of the output data Q may be generated, and the second bit may be an upper bit of the at least one first bit. For example, the four first flip-flops FF1 may receive the first local clock LC1 generated in operation S30 or operation S40, and generate the lower 3 bits Q[2:0] and 1 bit Q[3] of the output data Q.

Figure 10:
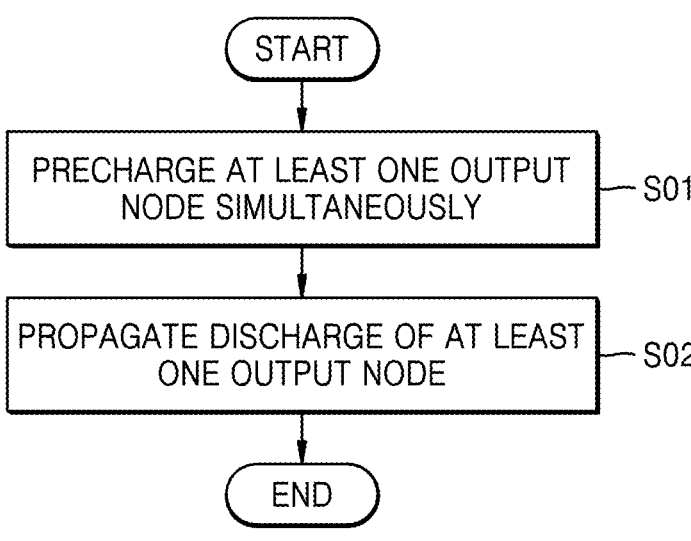
FIG. 10 is a flowchart illustrating operations of a counter, according to one or more example embodiments.

FIG. 10 is a flowchart illustrating operations of a counter, according to one or more example embodiments. For example, the flowchart of FIG. 10 illustrates an example of operations of the local clock generator LCG or pre-evaluator PE2 of FIG. 2. As illustrated in FIG. 10, the operations of the counter may include operations S01 and S02. In some embodiments, the operations of FIG. 10 may be performed by the local clock generator 40 of FIG. 4 or the pre-evaluator 60 of FIG. 6. The operations of FIG. 10 are described in conjunction with FIGS. 4 and 6.

Referring to FIG. 10, in operation S01, at least one output node may be precharged simultaneously. In some embodiments, the first to fourth PFETs P11 to P14 of the local clock generator 40 may simultaneously precharge, in response to a deactivated input clock CK, output nodes where the 4 bits LC1[3:0] of the first local clock LC1 are respectively generated. Accordingly, the 4 bits LC1[3:0] of the first local clock LC1 may be 1. In some embodiments, the first to fourth PFETs P21 to P24 of the pre-evaluator 60 may simultaneously precharge, in response to a deactivated output of the first multiplexer MUX21, output nodes where the 4 bits CAB1[3:0] of the first inverted ripple carry CAB1 are respectively generated. Accordingly, the 4 bits CA1[3:0] of the first ripple carry CA1 may be 0.

In operation S02, discharge of the at least one output node may be propagated. In some embodiments, in response to an activated input clock CK, the first NFET N11 of the local clock generator 40 may discharge the output node where the first bit LC1[0] of the first local clock LC1 is generated. The second to fourth NFETs N12 to N14 of the local clock generator 40 may discharge their corresponding output nodes only when all of the lower bits of the first local clock LC1 are discharged, and the discharge may propagate accordingly. In some embodiments, in response to an activated output of the first multiplexer MUX21, the first NFET N21 of the pre-evaluator 60 may discharge the output node where the first bit CAB1[0] of the first inverted ripple carry CAB1 is generated. The second to fourth NFETs N22 to N24 of the pre-evaluator 60 may discharge their corresponding output nodes only when all of the lower bits of the first inverted ripple carry CAB1 are discharged, and the discharge may propagate accordingly.

Figure 11:
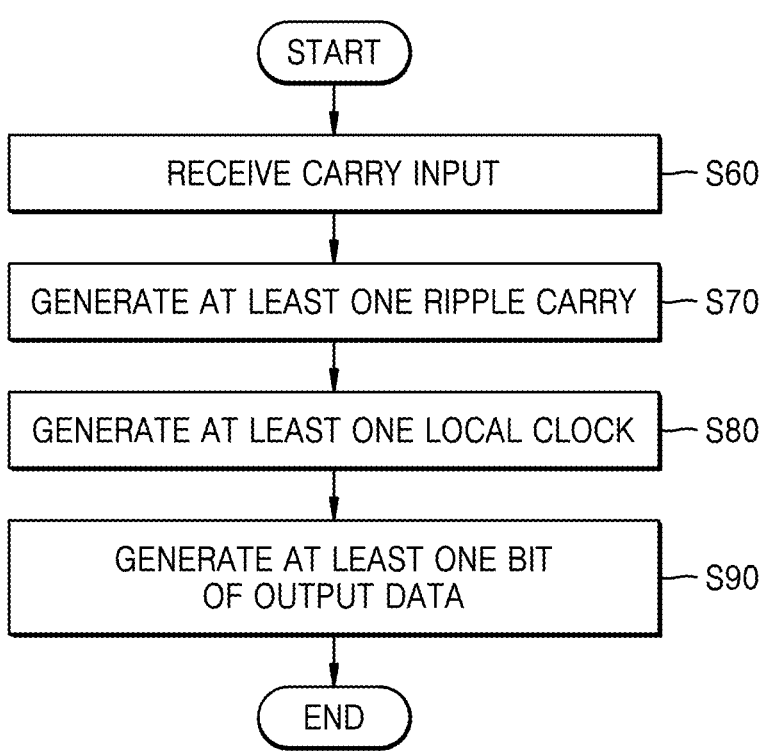
FIG. 11 is a flowchart illustrating operations of a counter, according to one or more example embodiments.

FIG. 11 is a flowchart illustrating operations of a counter, according to one or more example embodiments. Herein, the operations of FIG. 11 may be referred to as a method of generating output data Q that increases or decreases according to an input clock CK. As illustrated FIG. 11, the method of generating output data Q that increases or decreases according to the input clock CK may include a plurality of operations S60 to S90. In some embodiments, the method of FIG. 11 may be performed by the second segment SEG2 of FIG. 2, and may be performed in parallel with the method of FIG. 9. The method of FIG. 11 is described in conjunction with FIG. 2.

Referring to FIG. 11, a carry input may be received in operation S60. For example, the pre-evaluator PE2 may receive the first carry input CI1 from the first segment SEG1. In some embodiments, as described above with reference to FIG. 4, the first carry input CI1 may be generated by inverting the MSB, i.e., the fourth bit LC1[3], of the first local clock LC1.

In operation S70, at least one ripple carry may be generated. For example, the pre-evaluator PE2 may generate the first ripple carry CA1, based on the up signal UP and the 4 bits Q[6:3] of the output data Q. As described above with reference to FIG. 8A, the pre-evaluator PE2 may generate the first ripple carry CA1 based on the 4 bits Q[6:3] of the output data Q in response to an activated up signal UP, and generate the first ripple carry CA1 based on the 4 bits QB[6:3] of the inverted output data QB in response to a deactivated up signal UP.

In operation S80, at least one local clock may be generated. For example, the local clock selector LCS2 may generate the second local clock LC2, based on the first carry input CI1 received in operation S60 and the first ripple carry CA1 generated in operation S70.

In operation S90, at least one bit of output data Q may be generated. For example, the four second flip-flops FF2 may generate the 4 bits Q[7:4] of the output data Q that are toggled in response to the second local clock LC2 generated in operation S80.

Figure 12:
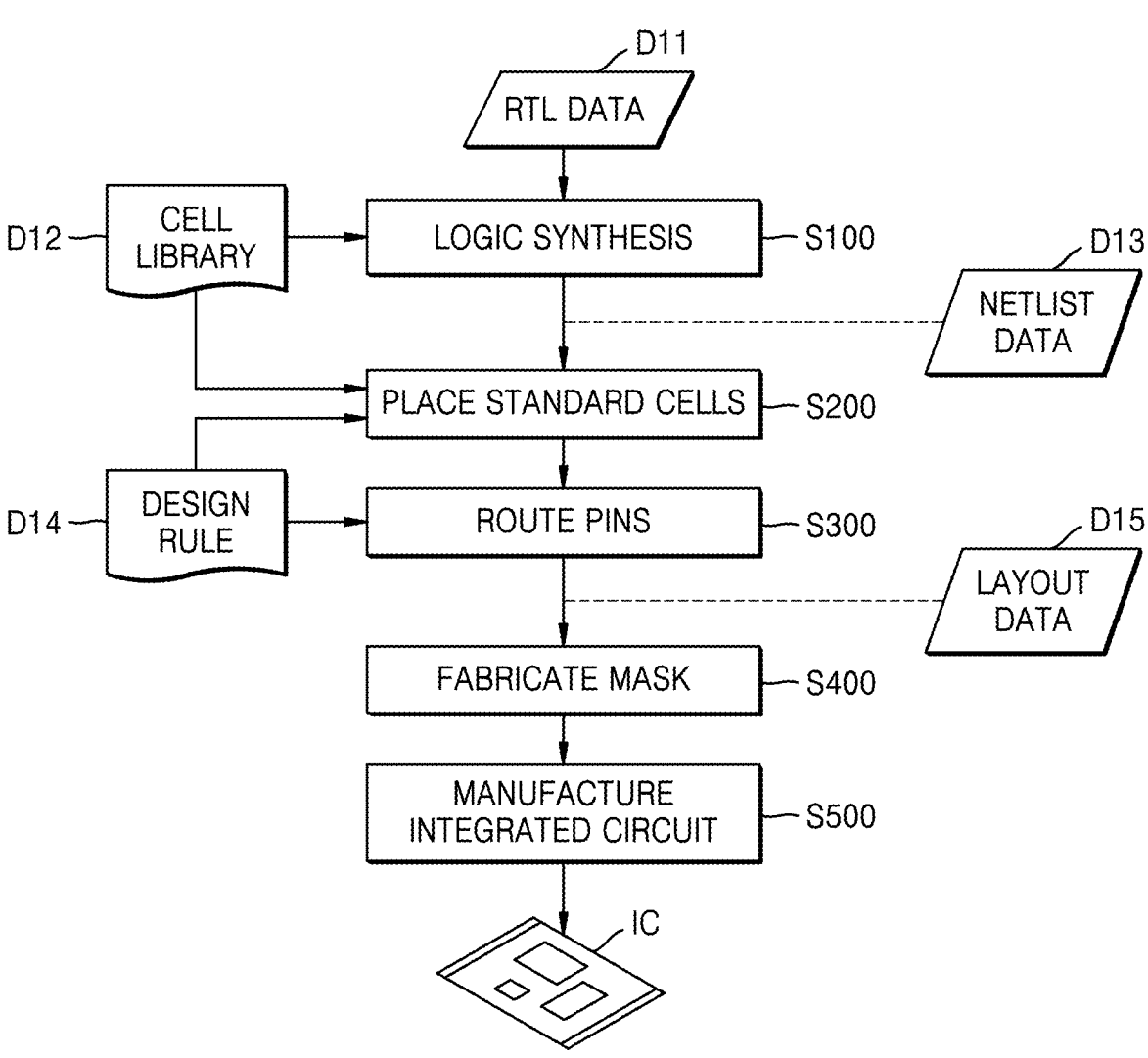
FIG. 12 is a flowchart of a method of manufacturing an integrated circuit, according to one or more example embodiments.

FIG. 12 is a flowchart of a method of manufacturing an IC, according to one or more example embodiments. In detail, the flowchart of FIG. 12 illustrates an example of a method of manufacturing an IC including standard cells. A standard cell is a unit of a layout included in an IC and may be designed to perform a predefined function. Referring to FIG. 12, the method of manufacturing an IC may include a plurality of operations S100 to S500.

A cell library (or a standard cell library) D12 may include information about standard cells, such as information about functions, characteristics, layout, etc. In some embodiments, the counter described above with reference to the figures, i.e., the bidirectional counter, may be included in the IC as standard cells. For example, the cell library D12 may include information about cells corresponding to the counter described above with reference to the figures. Accordingly, the IC may have a high operating speed and a reduced area.

A design rule D14 may include requirements that the layout of the IC must comply with. For example, the design rule D14 may include requirements for a space between patterns in the same layer, a minimum width of patterns, a routing direction for a wiring layer, etc. In some embodiments, the design rule D14 may define a minimum separation distance on the same track in a wiring layer.

In operation S100, a logic synthesis operation for generating netlist data D13 from register transfer level (RTL) data D11 may be performed. For example, a semiconductor design tool (e.g., a logic synthesis tool) may perform logic synthesis by referring to the cell library D12 from the RTL data D11 written in a hardware description language (HDL) such as very high-speed IC (VHSIC) HDL (VHDL) and Verilog, and generate the netlist data D13 including a bitstream or netlist. The netlist data D13 may correspond to an input of place and routing (P&R), as described below.

In operation S200, standard cells may be placed. For example, a semiconductor design tool (e.g., a P&R tool) may place standard cells used in the netlist data D13 with reference to the cell library D12. In some embodiments, the semiconductor design tool may place standard cells in rows extending parallel to each other, and the placed standard cells may receive power from power rails extending along boundaries of the rows.

In operation S300, pins of the standard cells may be routed. For example, the semiconductor design tool may generate interconnections that electrically connect output pins and input pins of the placed standard cells, and generate layout data D15 defining the placed standard cells and the generated interconnections. The interconnections may include vias in via layers and/or patterns in wiring layers. In some embodiments, wiring layers may include a front side wiring layer located above a gate electrode as well as a backside wiring layer located below the gate electrode. The layout data D15 may have, for example, a format like GDSII, and include geometric information of cells and interconnections. The semiconductor design tool may refer to the design rule D14 while routing the pins of the cells. The layout data D15 may correspond to an output of P&R. Operation S300 alone or both operation S200 and operation S300 may be referred to as a method of designing an IC.

In operation S400, an operation of fabricating a mask may be performed. For example, in photolithography, optical proximity correction (OPC) for correcting a distortion such as refraction caused by properties of light may be applied to the layout data D15. Patterns on a mask may be defined to form patterns in a plurality of layers based on data to which OPC is applied, and at least one mask (or photomask) for forming patterns in each of the plurality of layers may be fabricated. In some embodiments, a layout of the IC may be limitedly modified in operation S400, and the limited modification of the IC in operation S400 may be a post-processing for optimizing a structure of the IC, which may be referred to as design polishing.

In operation S500, an operation of manufacturing an IC may be performed. For example, the IC may be manufactured by patterning a plurality of layers by using the at least one mask fabricated in operation S400. Front-end-of-line (FEOL) processes may include, for example, planarizing and cleaning a wafer, forming a trench, forming a well, forming a gate electrode, and forming a source and a drain. Individual devices, such as transistors, capacitors, resistors, etc., may be formed on a substrate by performing the FEOL processes. In addition, back-end-of-line (BEOL) processes may include, for example, performing silicidation of a gate region, a source region, and a drain region, adding a dielectric, performing planarization, forming a hole, adding a metal layer, forming a via, forming a passivation layer, etc. Individual devices, such as transistors, capacitors, resistors, etc., may be interconnected by performing the BEOL processes. In some embodiments, middle-end-of-line (MEOL) may be performed between the FEOL and BEOL processes, and contacts may be formed on the individual devices. Thereafter, the IC may be packaged in a semiconductor package and used as a component in various applications.

Figure 13:
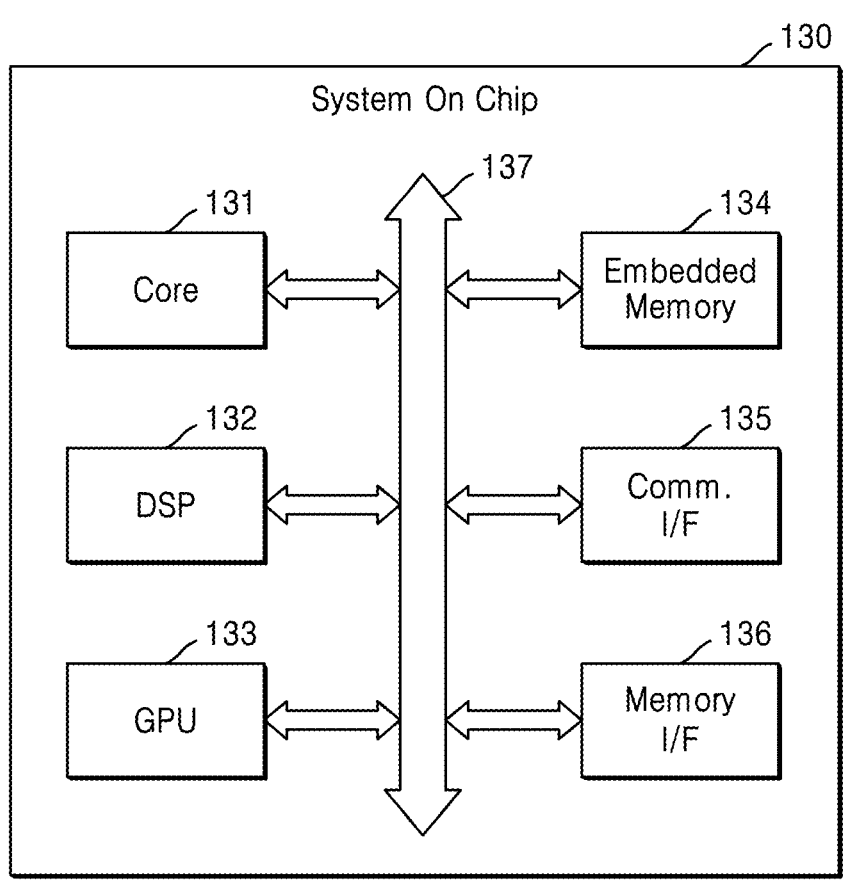
FIG. 13 is a block diagram of a system-on-chip according to one or more example embodiments.

FIG. 13 is a block diagram of a system-on-chip (SoC) 130 according to one or more example embodiments. The SoC 130 may refer to an IC that integrates components of a computing system or other electronic systems. For example, as an example of the SoC 130, an application processor (AP) may include a processor and components for other functions. Referring to FIG. 13, the SoC 130 may include a core 131, a digital signal processor (DSP) 132, a graphics processing unit (GPU) 133, an embedded memory 134, a communication interface 135, and a memory interface 136. The components of SoC 130 may communicate with one another via a bus 137.

The components of the SoC 130 may include a counter according to one or more example embodiments, described above with reference to the drawings. Accordingly, the components may have a high operating speed and a reduced area, and as a result, the performance and efficiency of the SoC 130 may be improved.

The core 131 may process instructions and control operations of the components included in the SoC 130. For example, by processing a series of instructions, the core 131 may run an operating system and execute applications on the operating system. The DSP 132 may generate useful data by processing digital signals, such as digital signals provided from the communication interface 135. The GPU 133 may generate data for an image output via a display device based on image data provided from the embedded memory 134 or the memory interface 136, or encode the image data. The embedded memory 134 may store data necessary for the core 131, DSP 132, and GPU 133 to operate. The communication interface 135 may provide an interface for a communication network or one-to-one communication. The memory interface 136 may provide an interface to an external memory of the SoC 130, such as a dynamic random access memory (DRAM) and a flash memory.

At least one of the components, elements, modules or units described herein may be embodied as various numbers of hardware, software and/or firmware structures that execute respective functions described above, according to one or more example embodiments. For example, at least one of these components, elements or units may use a direct circuit structure, such as a memory, a processor, a logic circuit, a look-up table, etc. that may execute the respective functions through controls of one or more microprocessors or other control apparatuses. Also, at least one of these components, elements or units may be specifically embodied by a module, a program, or a part of code, which contains one or more executable instructions for performing specified logic functions, and executed by one or more microprocessors or other control apparatuses. Also, at least one of these components, elements or units may further include or implemented by a processor such as a central processing unit (CPU) that performs the respective functions, a microprocessor, or the like. Two or more of these components, elements or units may be combined into one single component, element or unit which performs all operations or functions of the combined two or more components, elements of units. Also, at least part of functions of at least one of these components, elements or units may be performed by another of these components, element or units. Further, although a bus is not illustrated in some of block diagrams, communication between the components, elements or units may be performed through the bus. Functional aspects of the above embodiments may be implemented in algorithms that execute on one or more processors. Furthermore, the components, elements or units represented by a block or processing operations may employ any number of related art techniques for electronics configuration, signal processing and/or control, data processing and the like.

While example embodiments have been described in this specification by using particular terms, the terms are only used for describing the example embodiments and are not intended to limit the meaning or scope of the inventive concept as set forth in the claims. Thus, it will be understood by one of ordinary skill in the art that various changes and other embodiments are possible therefrom.

While the inventive concept has been particularly shown and described with reference to embodiments thereof, it will be understood that various changes in form and details may be made therein without departing from the spirit and scope of the following claims.

What is claimed is:

1. A bidirectional counter configured to generate output data based on an input clock, the bidirectional counter comprising:
   at least one first flip-flop configured to generate, based on at least one first local clock, at least one first bit of the output data and a second bit that is an upper bit of the at least one first bit, the at least one first bit including a least significant bit (LSB) of the output data; and
   a local clock generation circuit configured to generate, in response to an up signal that is activated, the at least one first local clock based on the input clock and the at least one first bit, and to generate, in response to the up signal that is deactivated, the at least one first local clock based on the input clock and at least one inverted first bit that corresponds to an inverted version of the at least one first bit.

2. The bidirectional counter of claim 1, wherein the local clock generation circuit comprises at least one multiplexer configured to respectively select, based on the up signal, the at least one first bit or the at least one inverted first bit.

3. The bidirectional counter of claim 2, wherein the local clock generation circuit comprises:
   at least one first transistor configured to respectively precharge, based on the input clock, at least one first output node at which the at least one first local clock is respectively generated; and
   at least one second transistor configured to propagate a discharge of the at least one first output node, based on the input clock and at least one output of the at least one multiplexer.

4. The bidirectional counter of claim 1, wherein the local clock generation circuit comprises at least one latch configured to respectively latch the at least one first local clock, and
   wherein each of the at least one latch comprises:

an inverter configured to receive one first local clock, of the at least one first local clock; and a p-channel field effect transistor (PFET) including a gate connected to an output of the inverter, a source to which a positive supply voltage is applied, and a drain connected to an input of the inverter.

5. The bidirectional counter of claim 1, wherein the local clock generation circuit is configured to generate a carry input based on the at least one first local clock, and the bidirectional counter further comprises:

at least one second flip-flop configured to generate, based on at least one second local clock, at least one third bit that is an upper bit of the second bit;

a pre-evaluation circuit configured to generate at least one ripple carry based on the up signal, the second bit, and the at least one third bit; and a local clock selection circuit configured to generate the at least one second local clock based on the input clock, the carry input, and the at least one ripple carry.

6. A bidirectional counter configured to generate output data based on an input clock, the bidirectional counter comprising:

at least one first flip-flop configured to generate, based on at least one first local clock, a most significant bit (MSB) of the output data and at least one first bit that is lower than the MSB;

a first pre-evaluation circuit configured to generate, in response to an up signal that is activated, at least one first ripple carry based on the at least one first bit and a second bit that is lower than the at least one first bit, and to generate, in response to the up signal that is deactivated, the at least one first ripple carry based on an inverted second bit that corresponds to an inverted version of the second bit and at least one inverted first bit that corresponds to an inverted version of the at least one first bit; and a first local clock selection circuit configured to generate the at least one first local clock based on the input clock, a first carry input, and the at least one first ripple carry.

7. The bidirectional counter of claim 6, wherein the first pre-evaluation circuit comprises at least one multiplexer configured to respectively select, based on the up signal, the second bit and the at least one first bit or the inverted second bit and the at least one inverted first bit.

8. The bidirectional counter of claim 7, wherein the first pre-evaluation circuit comprises:

at least one first transistor configured to respectively receive at least one output of the at least one multiplexer, and respectively precharge at least one first output node at which at least one inverted first ripple carry that corresponds to an inverted version of the at least one first ripple carry is generated; and at least one second transistor configured to respectively receive the at least one output of the at least one multiplexer and propagate a discharge of the at least one first output node.

9. The bidirectional counter of claim 6, wherein the first pre-evaluation circuit comprises at least one latch configured to respectively latch the at least one first ripple carry, and wherein each of the at least one latch comprises:

an inverter configured to receive a first ripple carry; and a p-channel field effect transistor (PFET) including a gate connected to an output of the inverter, a source to which a positive supply voltage is applied, and a drain connected to an input of the inverter.

10. The bidirectional counter of claim 6, wherein the first local clock selection circuit comprises at least one unit circuit corresponding to the at least one first local clock, and wherein each of the at least one unit circuit is configured to generate a first local clock, of the at least one first local clock, that is logic high when the input clock is logic low, generate the first local clock that is inverted to a first ripple carry when the input clock and the first carry input are logic high, and hold the first local clock when the input clock is logic low.

11. The bidirectional counter of claim 10, wherein each of the at least one unit circuit comprises:

a first p-channel field effect transistor (PFET) connected between a first node to which a positive supply voltage is applied and a second node to which the first local clock is output, and configured to receive the input clock;

a latch connected between the first node and the second node; and a first n-channel FET (NFET) and a second NFET connected in series with each other between the second node and a third node to which an inverted first ripple carry that corresponds to an inverted version of the first ripple carry is applied and configured to respectively receive the first carry input and the input clock.

12. The bidirectional counter of claim 11, wherein the latch comprises:

an inverter having an input connected to the second node; and a PFET including a gate connected to an output of the inverter, a source connected to the first node, and a drain connected to the second node.

13. The bidirectional counter of claim 10, wherein each of the at least one unit circuit comprises:

a first PFET connected between a first node to which a positive supply voltage is applied and a second node to which the first local clock is output, and configured to receive the input clock;

a latch connected between the first node and the second node; and first to third NFETs connected in series with one another between the second node and a third node to which a negative supply voltage is applied and configured to respectively receive the first carry input, the input clock, and the first ripple carry.

14. The bidirectional counter of claim 13, wherein the latch comprises:

an inverter having an input connected to the second node; and a PFET including a gate connected to an output of the inverter, a source connected to the first node, and a drain connected to the second node.

15. The bidirectional counter of claim 6, further comprising:

at least one second flip-flop configured to generate, based on at least one second local clock, the second bit and at least one third bit that is lower than the second bit;

a second pre-evaluation circuit configured to generate, in response to the up signal that is activated, at least one second ripple carry based on the at least one third bit and a fourth bit that is lower than the at least one third bit, and to generate, in response to the up signal that is deactivated, the at least one second ripple carry based on an inverted fourth bit that corresponds to an inverted version of the fourth bit and at least one inverted third bit that corresponds to an inverted version of the at least one third bit; and a second local clock selection circuit configured to generate the at least one second local clock, based on the input clock, a second carry input, and the at least one second ripple carry, wherein the second pre-evaluation circuit is configured to generate the first carry input from the at least one second ripple carry.

16. A method of generating output data that increases or decreases according to an input clock, the method being performed by a counter comprising a local clock generation circuit and at least one first flip-flop, the method comprising:

receiving an up signal;

generating, by the local clock generation circuit, in response to the up signal that is activated, at least one first local clock based on the input clock and at least one first bit of the output data, the at least one first bit including a least significant bit (LSB) of the output data;

generating, by the local clock generation circuit, in response to the up signal that is deactivated, the at least one first local clock based on the input clock and at least one inverted first bit that corresponds to an inverted version of the at least one first bit; and generating, by the at least one first flip-flop, based on the at least one first local clock, the at least one first bit and a second bit that is an upper bit of the at least one first bit.

17. The method of claim 16, wherein the generating the at least one first local clock in response to the activated up signal comprises respectively selecting the at least one first bit based on the activated up signal, and wherein the generating the at least one first local clock in response to the deactivated up signal comprises respectively selecting the at least one inverted first bit based on the deactivated up signal.

18. The method of claim 16, wherein the generating the at least one first local clock in response to the activated up signal comprises:

simultaneously precharging, based on the input clock, at least one first output node at which the at least one first local clock is generated; and propagating a discharge of the at least one first output node based on the input clock and the at least one first bit.

19. The method of claim 16, wherein the generating the at least one first local clock in response to the deactivated up signal comprises:

simultaneously precharging, based on the input clock, at least one first output node at which the at least one first local clock is generated; and propagating a discharge of the at least one first output node, based on the input clock and the at least one inverted first bit.

20. The method of claim 16, wherein the counter further comprises a pre-evaluation circuit, a local clock selection circuit, and at least one second flip-flop, the method further comprising:

generating, by the local clock generation circuit, a carry input based on the at least one first local clock;

generating, by the pre-evaluation circuit, at least one ripple carry, based on the up signal, the second bit and at least one third bit that is an upper bit of the second bit;

generating, by the local clock selection circuit, at least one second local clock, based on the input clock, the carry input, and the at least one ripple carry;

generating, by the at least one second flip-flop, the at least one third bit based on the at least one second local clock.

\* \* \* \* \*